(12) United States Patent
Seo

(10) Patent No.: US 10,418,560 B2
(45) Date of Patent: *Sep. 17, 2019

(54) ORGANIC LIGHT EMITTING DIODE DEVICE

(71) Applicant: Samsung Display Co., Ltd., Yongin-si, Gyeonggi-do (KR)

(72) Inventor: Ji-Hyun Seo, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 72 days.

This patent is subject to a terminal disclaimer.

(21) Appl. No.: 15/489,656

(22) Filed: Apr. 17, 2017

(65) Prior Publication Data
US 2017/0222154 A1     Aug. 3, 2017

Related U.S. Application Data

(63) Continuation of application No. 14/042,581, filed on Sep. 30, 2013, now Pat. No. 9,627,628.

(30) Foreign Application Priority Data

Jun. 17, 2013 (KR) .................. 10-2013-0069207

(51) Int. Cl.
| | | |
|---|---|---|
| H01L 51/00 | (2006.01) | |
| H01L 51/50 | (2006.01) | |
| C09K 11/06 | (2006.01) | |

(52) U.S. Cl.
CPC .......... *H01L 51/0058* (2013.01); *C09K 11/06* (2013.01); *H01L 51/0062* (2013.01); *H01L 51/0067* (2013.01); *H01L 51/0072* (2013.01); *H01L 51/504* (2013.01); *H01L 51/5012* (2013.01); *H01L 51/5072* (2013.01); *H01L 51/5088* (2013.01); *H01L 51/0052* (2013.01); *H01L 51/0074* (2013.01); *H01L 51/0085* (2013.01); *H01L 2251/308* (2013.01)

(58) Field of Classification Search
CPC ............. H01L 51/0067; H01L 51/5012; H01L 51/0058; H01L 51/504; H01L 51/5072
See application file for complete search history.

(56) References Cited

U.S. PATENT DOCUMENTS

| 9,627,628 B2 * | 4/2017 | Seo ..................... H01L 51/0072 |
| 2009/0140239 A1 | 6/2009 | Lee et al. |
| 2011/0156013 A1 | 6/2011 | Kim et al. |
| 2011/0240984 A1 | 10/2011 | Adamovich et al. |
| 2011/0272676 A1 | 11/2011 | Jung et al. |
| 2013/0175510 A1 | 7/2013 | Ma et al. |

FOREIGN PATENT DOCUMENTS

| EP | 2 213 641 A1 | 8/2010 |
| JP | 2011-121934 A | 6/2011 |
| KR | 10-2006-0032101 A | 4/2006 |
| KR | 10-2010-0063713 A | 6/2010 |
| KR | 10-2010-0090269 A | 8/2010 |
| KR | 10-2011-0107680 | 10/2011 |
| KR | 10-2011-0107681 | 10/2011 |
| KR | 10-2011-0113469 | 10/2011 |
| KR | 10-2011-0123172 | 11/2011 |

* cited by examiner

*Primary Examiner* — Gregory Listvoyb
(74) *Attorney, Agent, or Firm* — Lewis Roca Rothgerber Christie LLP

(57) ABSTRACT

An organic light emitting diode device including an electron transport layer containing a compound represented by Chemical Formula 1, and an emission layer containing a compound represented by Chemical Formula 2.

Chemical Formula 1

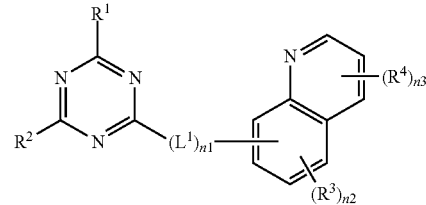

Chemical Formula 2

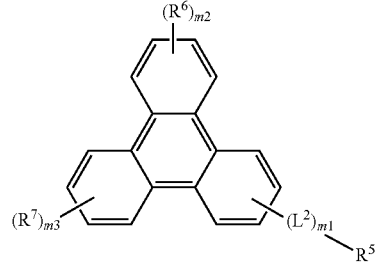

10 Claims, 2 Drawing Sheets

ORGANIC LIGHT EMITTING DIODE DEVICE

CROSS-REFERENCE TO RELATED APPLICATION

This application is a continuation of U.S. patent application Ser. No. 14/042,581, filed Sep. 30, 2013, which claims priority to and the benefit of Korean Patent Application No. 10-2013-0069207, filed Jun. 17, 2013, the entire content of both of which is incorporated herein by reference.

BACKGROUND

1. Field

The present invention relates to an organic light emitting diode device.

2. Description of the Related Art

Recent trends toward lightweight and thin personal computers and televisions sets also require lightweight and thin display devices, and flat panel displays satisfying such requirements are being substituted for conventional cathode ray tubes (CRTs). However, since the LCD, currently used in thin display devices, is a passive display device, an additional back-light source is needed. Additionally, the LCD has various problems such as a slow response time and a narrow viewing angle.

In this connection, an organic light emitting diode (OLED) display has recently been spotlighted as a display device that has advantages such as a wide viewing angle, high contrast, and a fast response time.

In the organic light emitting diode device, electrons injected from one electrode and holes injected from another electrode are combined with each other in an emission layer, thereby generating excitons that output energy and thereby emit light.

The above information disclosed in this Background section is only for enhancement of understanding of the background of the invention and therefore it may contain information that does not form the prior art that is already known in this country to a person of ordinary skill in the art.

SUMMARY

One or more aspects of embodiments of the present invention are directed to an organic light emitting diode (OLED) display capable of improving efficiency and lifespan characteristics thereof.

An embodiment of the present invention provides an organic light emitting diode device, including an anode; a cathode facing the anode; an emission layer between the anode and the cathode; and an electron transport layer (ETL) between the cathode and the emission layer, the ETL containing a compound represented by Chemical Formula 1.

Chemical Formula 1

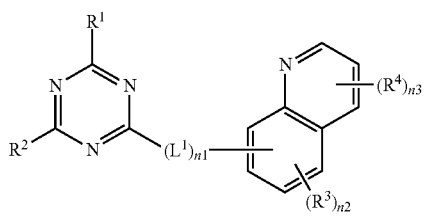

In Chemical Formula 1, $L^1$ is a substituted or unsubstituted C6 to C30 arylene group or a substituted or unsubstituted C2 to C30 heteroarylene group, $R^1$ to $R^4$ are each independently selected from a hydrogen atom, a heavy hydrogen atom, a substituted or unsubstituted C1 to C30 alkyl group, a substituted or unsubstituted C3 to C30 cycloalkyl group, a substituted or unsubstituted C6 to C30 aryl group, a substituted or unsubstituted C1 to C30 heteroaryl group, a substituted or unsubstituted C1 to C30 amine group, or a substituted or unsubstituted silyl group; n1 is an integer ranging from 0 to 2; and n2 and n3 are each independently integers ranging from 0 to 3.

In some embodiments, $R^1$ and $R^2$ may be each independently a hydrogen atom, or a substituted or unsubstituted C6 to C30 aryl group; $L^1$ may be a substituted or unsubstituted C6 to C30 arylene group, n1 may be 1; and n2 and n3 may each independently be 0.

In some embodiments, $L^1$ may be a substituted or unsubstituted phenylene group or a substituted or unsubstituted naphthylene group.

The compound represented by Chemical Formula 1 may be represented by one of Chemical Formulae 1-1 to 1-8.

[1-1]

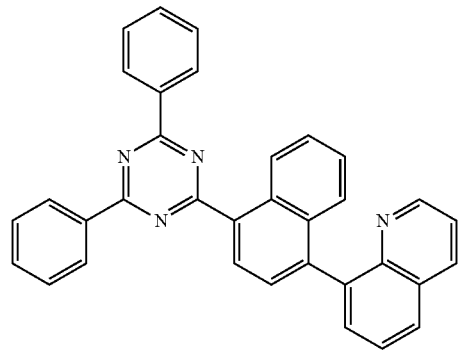

[1-2]

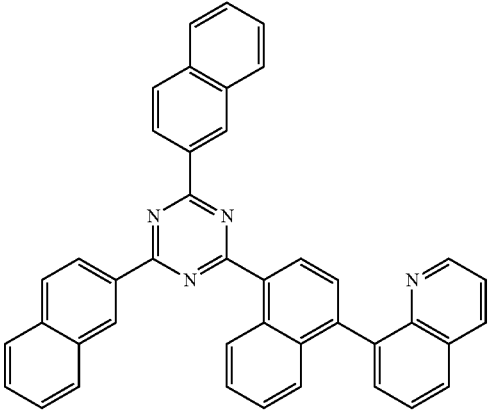

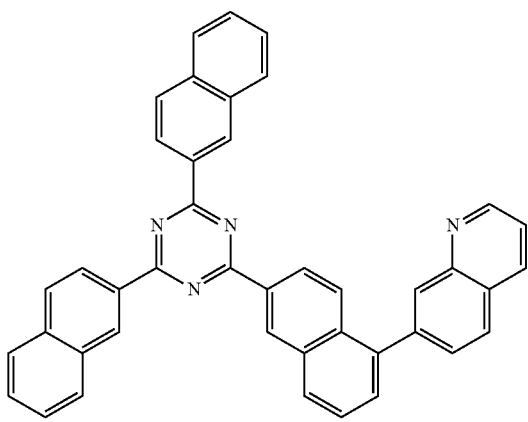

[1-3]

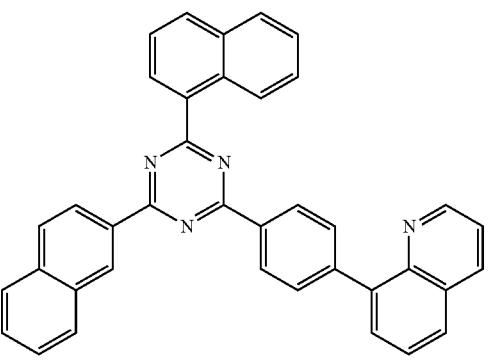

[1-7]

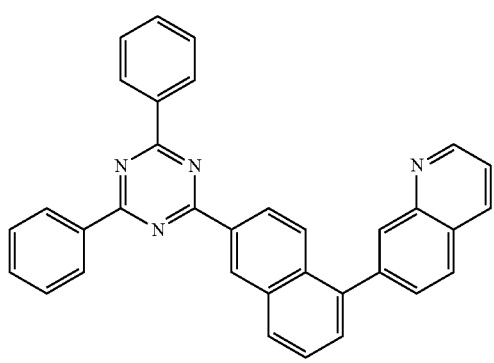

[1-4]

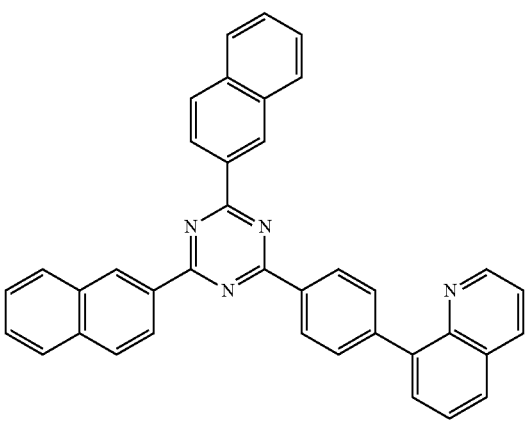

[1-8]

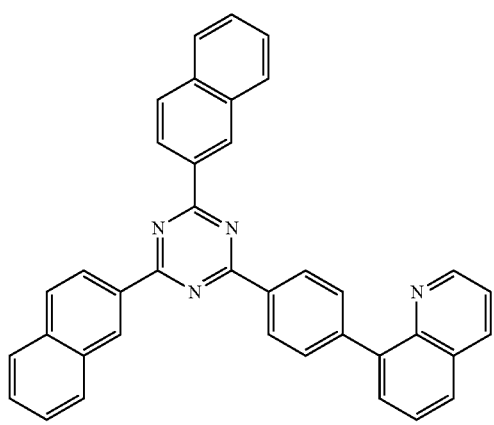

[1-5]

[1-6]

The emission layer may contain a compound represented by Chemical Formula 2.

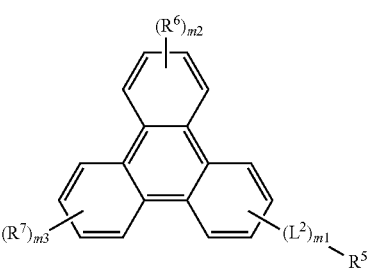

Chemical Formula 2

In Chemical Formula 2, $L^2$ may be a substituted or unsubstituted C6 to C30 arylene group or a substituted or unsubstituted C2 to C30 heteroarylene group, $R^5$ may be selected from a hydrogen atom, a substituted or unsubstituted C6 to C30 aryl group, a substituted or unsubstituted C1 to C30 heteroaryl group, a substituted or unsubstituted C1 to C30 amine group, or a substituted or unsubstituted silyl group; $R^6$ and $R^7$ may be each independently selected from a hydrogen atom, a heavy hydrogen atom, a substituted or unsubstituted C1 to C30 alkyl group, a substituted or unsubstituted C3 to C30 cycloalkyl group, a substituted or unsubstituted C6 to C30 aryl group, a substituted or unsubstituted C1 to C30 heteroaryl group, a substituted or unsubstituted C1 to C30 amine group, or a substituted or unsubstituted silyl group;

m1 may be an integer ranging from 0 to 2; and m2 and m3 may each independently be integers ranging from 0 to 4.

In some embodiments, $L^2$ may be a substituted or unsubstituted C6 to C30 arylene group, $R^5$ may be selected from a hydrogen atom, a substituted or unsubstituted C6 to C30 aryl group, a substituted or unsubstituted C1 to C30 heteroaryl group, a substituted or unsubstituted C1 to C30 amine group, or a substituted or unsubstituted silyl group; m1 may be an integer ranging from 0 to 2; and m2 and m3 may each independently be 0.

In some embodiments, $L^2$ may be a substituted or unsubstituted phenylene group or a substituted or unsubstituted naphthylene group.

The compound represented by Chemical Formula 2 may be represented by one of Chemical Formulae 2-1 to 2-24.

[2-1]
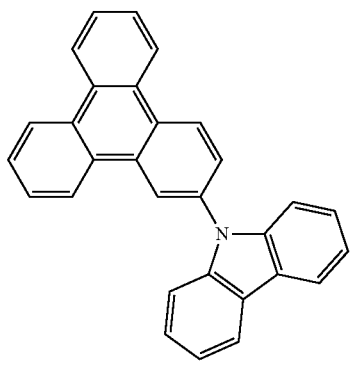

[2-2]
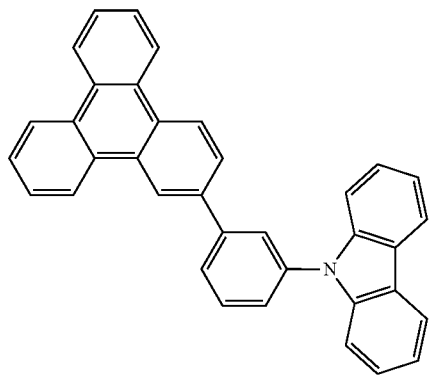

[2-3]
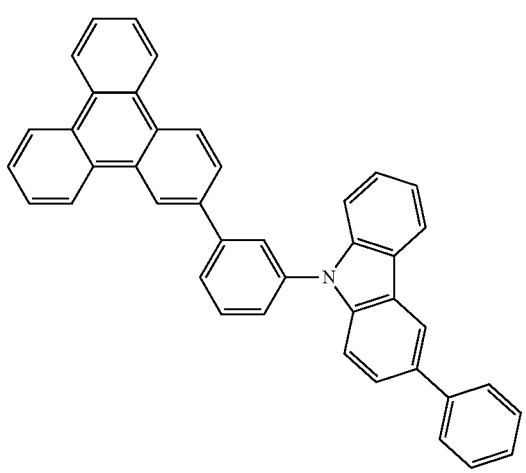

-continued

[2-4]
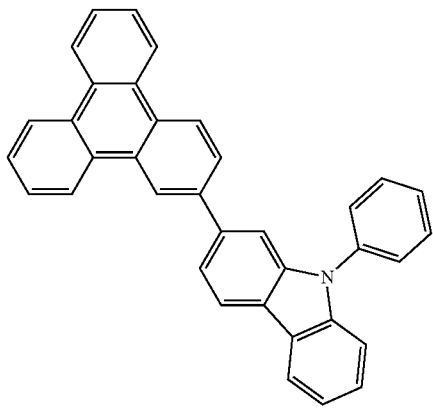

[2-5]
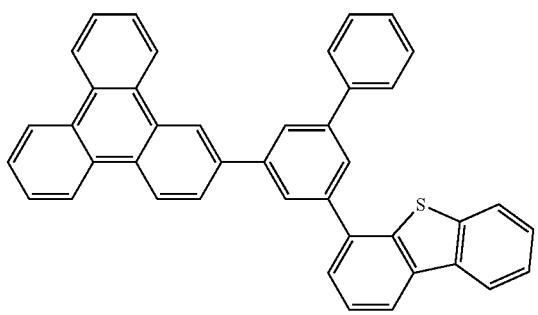

[2-6]
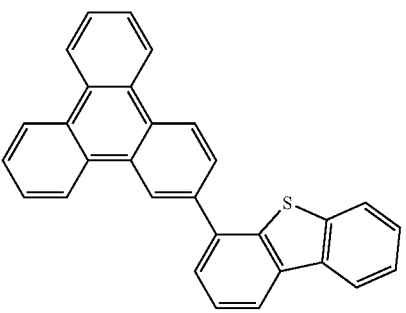

[2-7]
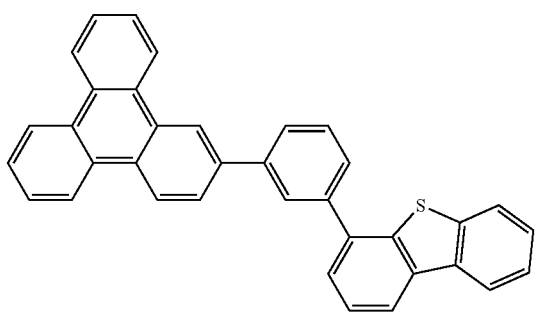

[2-8]
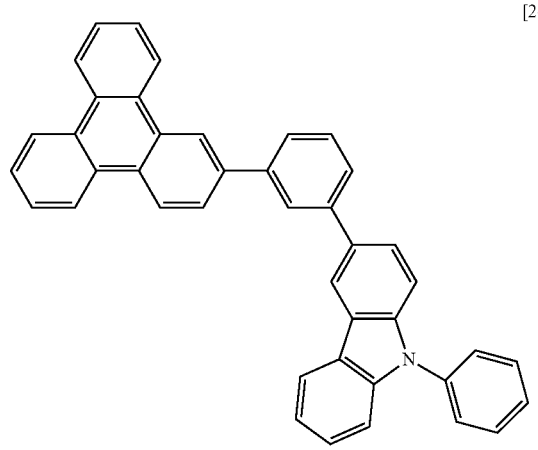
[2-9]
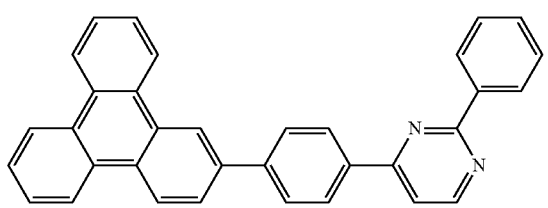
[2-10]
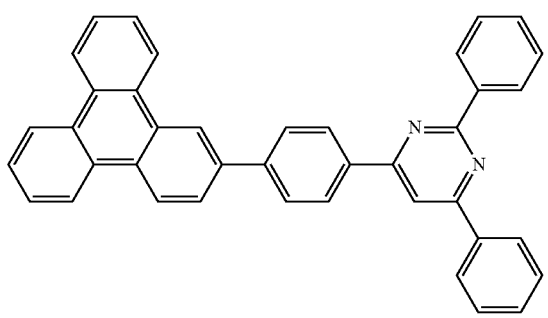
[2-11]
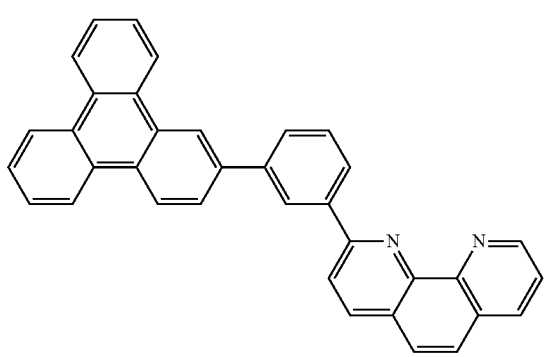
[2-12]
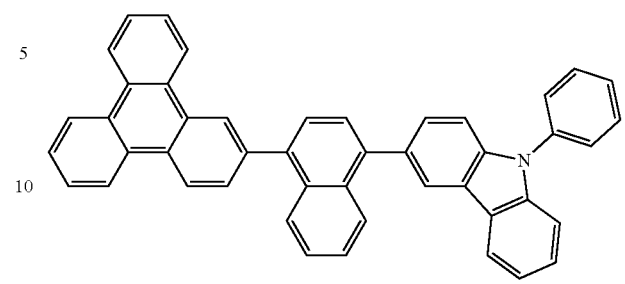
[2-13]
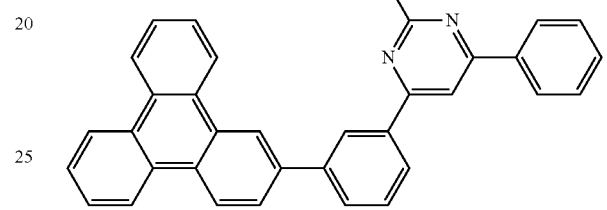
[2-14]
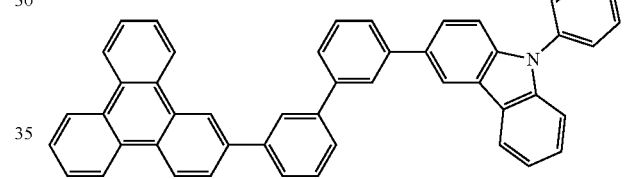
[2-15]
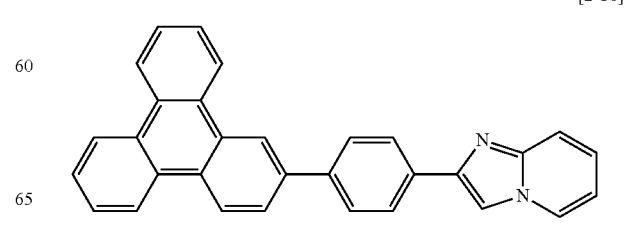
[2-16]

[2-17]
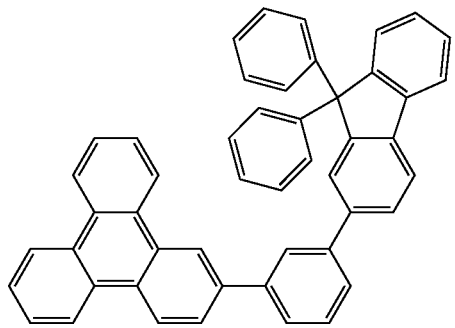

[2-18]
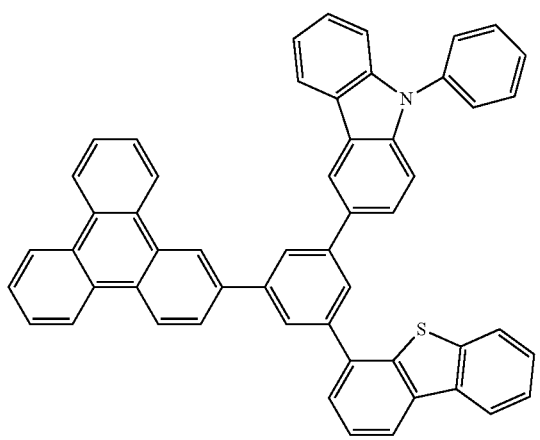

[2-19]
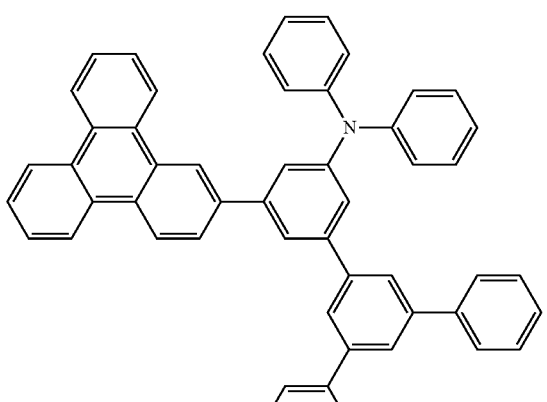

[2-20]
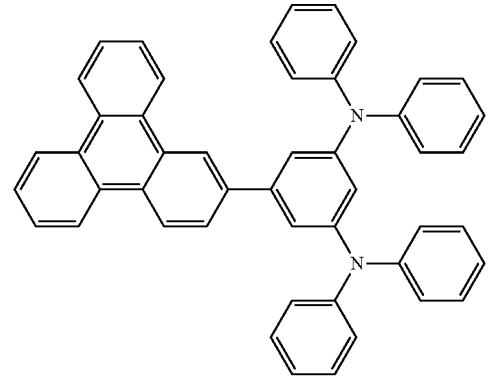

[2-21]
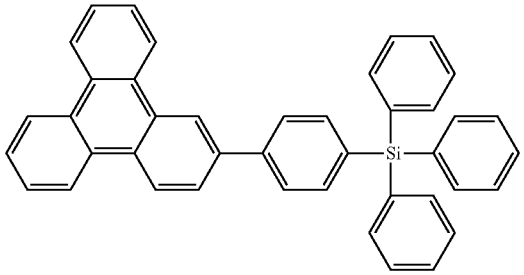

[2-22]
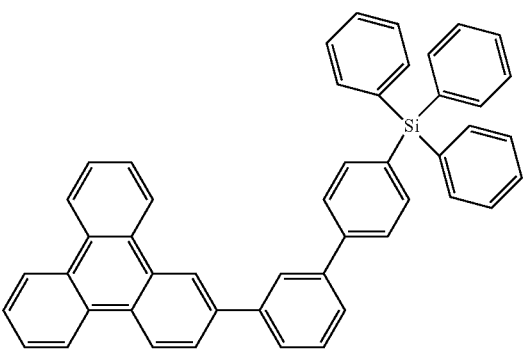

[2-23]
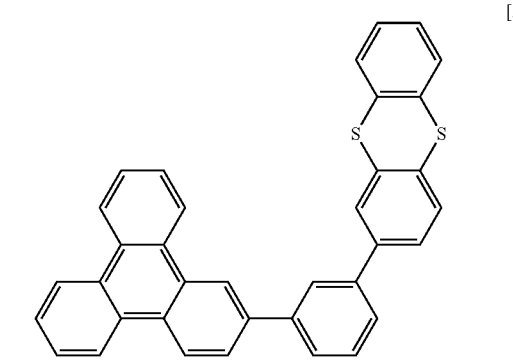

[2-24]
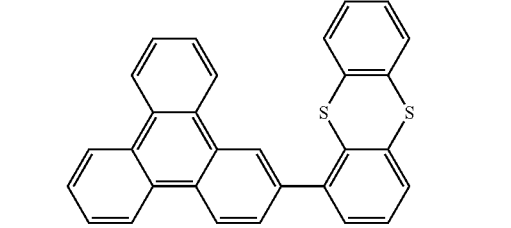

The emission layer may contain the compound represented by Chemical Formula 2 as a host material, and may further contain a dopant material.

The dopant material may include a phosphorescent dopant material.

The host material and the dopant material may be contained in a weight ratio ranging from 6:4 to 9:1.

Other details of exemplary embodiments of the present invention are included in the detailed description.

It is possible to provide an organic light emitting diode device having high efficiency and a long life-span by using organic materials of embodiments of the present invention.

BRIEF DESCRIPTION OF THE DRAWINGS

The accompanying drawings, together with the specification, illustrate embodiments of the present invention, and, together with the description, serve to explain the principles of the present invention.

DETAILED DESCRIPTION

Figure 1:
FIG. 1 and FIG. 2 show the structure of an organic light emitting diode device in accordance with embodiments of the present invention.

Hereinafter, embodiments of the present invention will be described in detail with reference to the attached drawings such that the present invention can be easily put into practice by those skilled in the art. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals designate like elements throughout the specification. Throughout this specification, when a first part of a layer, a film, a plate or the like is described as being arranged "on" a second part, this indicates the first part is arranged on the second part directly or with a third part therebetween. In contrast, when an element is described as being "directly on" another element, there are no intervening elements present. Further, the use of "may" when describing embodiments of the present invention refers to "one or more embodiments of the present invention."

In this specification, when a target element is described as being "substituted", this indicates that the target element is substituted with at least one substituent selected from the group consisting of a heavy hydrogen atom, a C1 to C30 alkyl group, a C6 to C30 aryl group, a C1 to C30 heteroaryl group, a C1 to C30 alkoxy group, a C2 to C30 alkenyl group, a C6 to C30 aryloxy group, a C3 to C30 silyloxy group, a C1 to C30 acyl group, a C2 to C30 acyloxy group, a C2 to C30 heteroaryloxy group, a C1 to C30 sulfonyl group, a C1 to C30 alkylthiol group, a C6 to C30 arylthiol group, a C1 to C30 heterocyclothiol group, a C1 to C30 phosphate amide group, a C3 to C30 silyl group, NRR' (herein, R and R' each independently indicate substituents selected from a hydrogen atom, a heavy hydrogen atom, a C1 to C30 alkyl group, or a C6 to C30 aryl group), a carboxyl group, a halogen group, a cyano group, a nitro group, an azo group, a fluorine group, and a hydroxyl group, unless otherwise defined.

Further, in this specification, the prefix "hetero" indicates that 1 to 3 heteroelements selected from the group consisting of B, N, O, S, P, Si, and P($=$O) are contained in one ring, and the other elements of the ring are carbon atoms, unless otherwise defined.

Hereinafter, the definitions of main groups used in chemical formulae in the present application will be described (the carbon number for defining substituents is unrestrictive and does not restrict the characteristics of the substituents).

An unsubstituted C1 to C30 alkyl group may refer to a linear alkane or branched alkane, and non-limiting examples of the alkyl group may include methyl, ethyl, propyl, iso-butyl, sec-butyl, pentyl, iso-amyl, hexyl, heptyl, octyl, nonyl, dodecyl, or the like.

An unsubstituted C2 to C30 alkenyl group may indicate that at least one carbon-carbon double bond is contained at one or more positions along a carbon chain of the unsubstituted C2 to C30 alkyl group. For example, the unsubstituted C2 to C30 alkenyl group may include a terminal alkene and/or an internal alkene. Non-limiting examples of the alkenyl group include ethenyl, propenyl, or the like.

An unsubstituted C2 to C30 alkynyl group indicates that at least one carbon-carbon triple bond is contained at one or more positions along a carbon chain of the unsubstituted C2 to C30 alkyl group. For example, the unsubstituted C2 to C30 alkynyl group may include a terminal alkyne and/or an internal alkyne. Non-limiting examples of the alkynyl group include acetylene, acetylene, propylene, phenylacetylene, naphthylacetylene, iso-propylacetylene, t-butylacetylene, diphenylacetylene, or the like.

An unsubstituted C3 to C30 cycloalkyl group may refer to an annular alkyl group having a carbon number ranging from 3 to 30.

An unsubstituted C1 to C30 alkoxy group may refer to a group having the structure of "—OA" (herein, "A" is an unsubstituted C1 to C30 alkyl group), and non-limited examples of the alkoxy group include methoxy, ethoxy, propoxy, iso-propyloxy, butoxy, pentoxy, or the like.

An unsubstituted C6 to C30 aryl group may refer to a carbocyclic aromatic system having at least one ring. In the case of having two or more rings, these rings may be connected to each other via a single bond or by being fused with each other. The terms "aryl" may include an aromatic system such as phenyl, naphthyl, anthracenyl, or the like. An example of the unsubstituted C6 to C30 aryl group may include one selected from the group consisting of a phenyl group, a tolyl group, a biphenyl group, a naphthyl group, an anthracenyl group, a terphenyl group, a fluorenyl group, a phenanthrenyl group, a pyrenyl group, a diphenylanthracenyl group, a naphthylanthracenyl group, a pentacenyl group, a bromophenyl group, a hydroxyphenyl group, a stilbene group, an azobenzene group, and a ferrocenyl group.

An unsubstituted C1 to C30 heteroaryl group may refer to the unsubstituted aryl group which has 1, 2, or 3 heteroatoms selected from a group consisting of B, N, O, S, P, Si, and P($=$O) as ring atoms. In the case of having two or more rings, these rings may be connected to each other via a single bond or by being fused with each other. Non-limiting examples of the unsubstituted C1 to C30 heteroaryl group include a pyrazolyl group, an imidazolyl group, an oxazolyl group, a triazolyl group, a triazinyl group, a triazolyl group, a tetrazolyl group, an oxadiazole group, a thiadiazole group, a pyridinyl group, a pyridazinyl group, a pyrimidinyl group, a triazinyl group, a carbazole group, an N-phenylcarbazole group, an indolyl group, a quinolyl group, an isoquinolyl group, a thiophene group, a dibenzothiophene group, a dibenzofuran group, and a benzimidazolyl group.

An unsubstituted C6 to C30 aryloxy group may refer to a group represented by —OA$_1$. Herein, A$_1$ is substantially the same functional group as that of the C6 to C30 aryl group, except the C6 to C30 aryloxy group may have a different number of carbon atoms. Non-limiting example of the aryloxy group is a phenoxy group.

An unsubstituted C6 to C30 arylthiol group may refer to a group represented by —SA$_1$. Herein, A$_1$ is substantially the same functional group as that of the C6 to C30 aryl group, except the C6 to C30 arylthiol group may have a different number of carbon atoms. Non-limiting examples of the arylthiol group may include a benzenethiol group, a naphthylthiol group, or the like.

In this specification, "hole characteristic" may refer to a characteristic serving to facilitate the injection of holes into an emission layer and the movement of the holes, the holes being formed in an anode by having a conductivity characteristic according to a HOMO level. Specifically, the hole characteristic may be similar to a characteristic that pushes electrons.

Further, "electron characteristic" may refer to a characteristic serving to facilitate the injection of electrons into an emission layer and the movement of the electrons, the electrons being formed in a cathode by having the conductivity characteristic according to the HOMO level. Specifically, the hole characteristic may be similar to a characteristic that pulls electrons.

Hereinafter, an organic light emitting diode device will be described in detail in accordance with embodiments of the present invention.

FIG. 1 is a cross-sectional view showing an organic light emitting diode device in accordance with embodiments of the present invention.

Referring to FIG. 1, the organic light emitting diode device includes an anode 10; a cathode 20 facing the anode 10; an emission layer 50 positioned between the anode 10 and the cathode 20; a hole transport layer (HTL) 30 positioned between the anode 10 and the emission layer 50; and an electron transport layer (ETL) 40 positioned between the cathode 20 and the emission layer 50.

The substrate (not shown) may be located at the side of the anode 10 or the cathode 20. The substrate may be made of, for example, an inorganic material such as glass, an organic material such as polycarbonate, (PC), polymethylmethacrylate (PMMA), polyethylene terephthalate (PET), polyamide (PA), polyethersulfone (PES), or a combination thereof, a silicon wafer, or the like.

The anode 10 may be a transparent or non-transparent electrode. The transparent electrode may be made of a conductive oxide, for example, indium tin oxide (ITO), indium zinc oxide (IZO), tin oxide ($SnO_2$), zinc oxide (ZnO), or a combination thereof, or a thin metal such as aluminum, silver, or magnesium. In some embodiments, the non-transparent electrode may be made of a metal such as aluminum, silver, or magnesium.

The cathode 20 may be a cathode with a small work function to facilitate electron injection. Non-limiting examples of the cathode 20 include a metal such as magnesium, calcium, sodium, potassium, titanium, indium, yttrium, lithium, gadolinium, aluminum, silver, tin, lead, cesium, barium, or an alloy thereof. In some embodiments, the cathode 20 has a multi-layer structure such as LiF/Al, $LiO_2$/Al, LiF/Ca, LiF/Al, or $BaF_2$/Ca, but embodiments of the invention are not limited thereto. In some embodiments, the electrode made from a metal such as aluminum or the like may be employed as the cathode 20.

In some embodiments, the ETL 40 contains a compound represented by Chemical Formula 1.

Chemical Formula 1

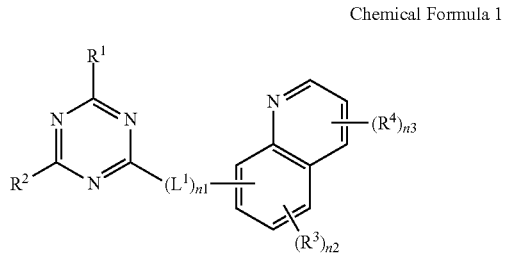

In Chemical Formula 1,
$L^1$ is a substituted or unsubstituted C6 to C30 arylene group or a substituted or unsubstituted C2 to C30 heteroarylene group, $R^1$ to $R^4$ are each independently selected from a hydrogen atom, a heavy hydrogen atom, a substituted or unsubstituted C1 to C30 alkyl group, a substituted or unsubstituted C3 to C30 cycloalkyl group, a substituted or unsubstituted C6 to C30 aryl group, a substituted or unsubstituted C1 to C30 heteroaryl group, a substituted or unsubstituted C1 to C30 amine group, or a substituted or unsubstituted silyl group; n1 is an integer ranging from 0 to 2, and n2 and n3 are each independently integers ranging from 0 to 3.

In some embodiments, the compound represented by the Chemical Formula 1 contains quinoline. In the embodiments where quinoline has excellent electron affinity, it may serve to improve the electron-accepting capacity of the compound of Chemical Formula 1. If a polaron having a negative charge is generated, it may be possible to obtain high stability when the compound of Chemical Formula 1 is employed as a material. Additionally, an electron mobility characteristic may be increased, and it may be possible to obtain a high glass transition temperature and high thermal stability due to the heteroaromatic structure of the compound of Chemical Formula 1.

In an embodiment of the present invention, $R^1$ and $R^2$ may each independently be a hydrogen atom, or a substituted or unsubstituted C6 to C30 aryl group; $L^1$ may be a substituted or unsubstituted C6 to C30 arylene group, n1 may be 1; and n2 and n3 may each independently be 0.

In one embodiment, $L^1$ may be a substituted or unsubstituted phenylene group or a substituted or unsubstituted naphthylene group. In this case, it may be possible to adequately adjust the hole characteristic and/or the electron characteristic of the compound.

The compound represented by Chemical Formula 1 may be represented by one of Chemical Formulae 1-1 to 1-8.

[1-1]

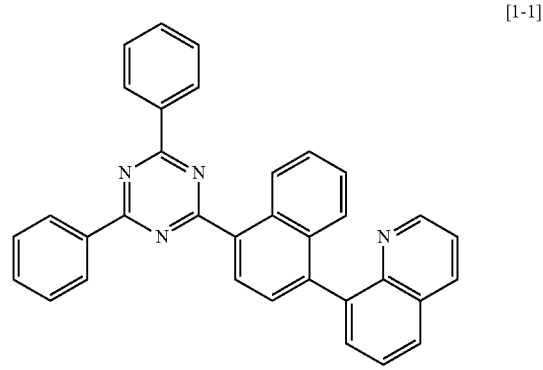

[1-2]

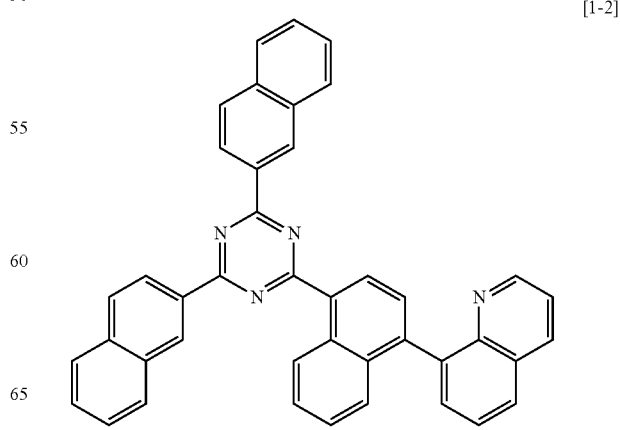

[1-3]
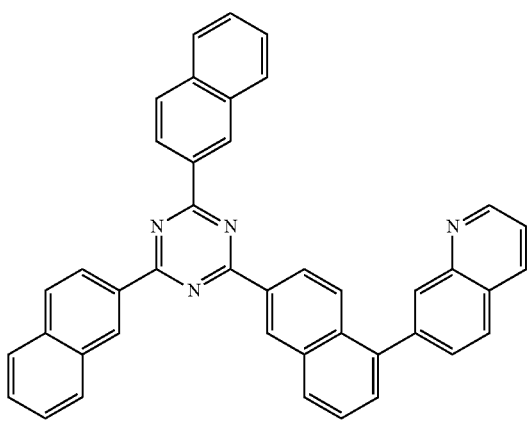
[1-4]
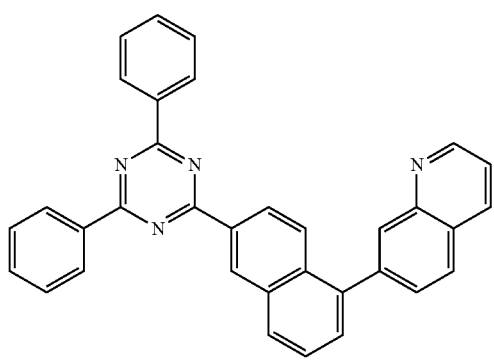
[1-5]
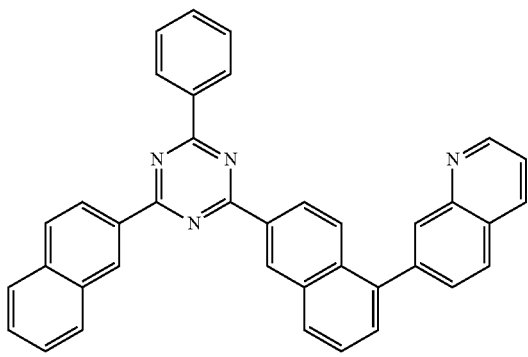
[1-6]
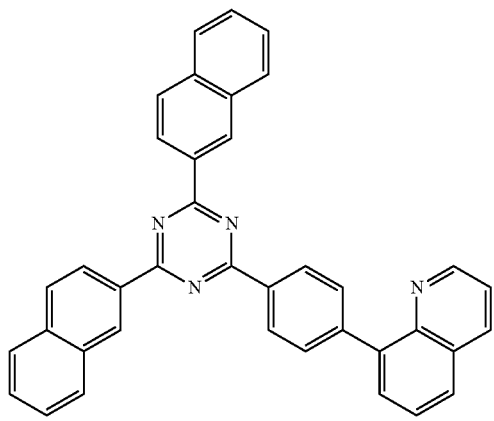
[1-7]
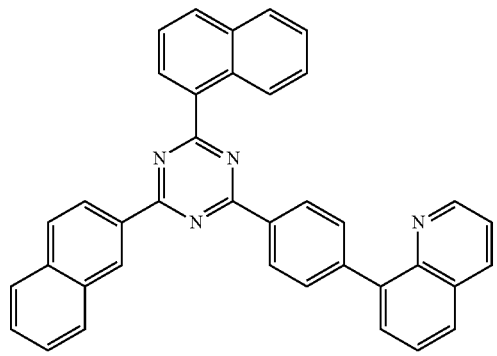
[1-8]
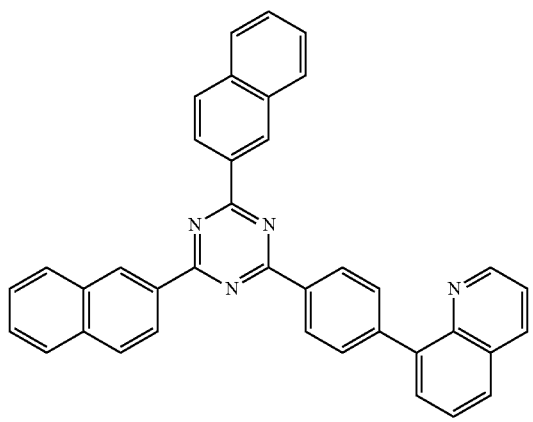
The ETL 40 may include an electron transport organic compound and a metal-containing material. Non-limiting examples of the electron transport organic compound include DNA (9,10-di(naphthalen-1-yl)anthracene) and an anthracene-based compound represented by Chemical Formulae 101 and 102, but embodiments of the invention are not limited thereto.
[Chemical Formula 101]
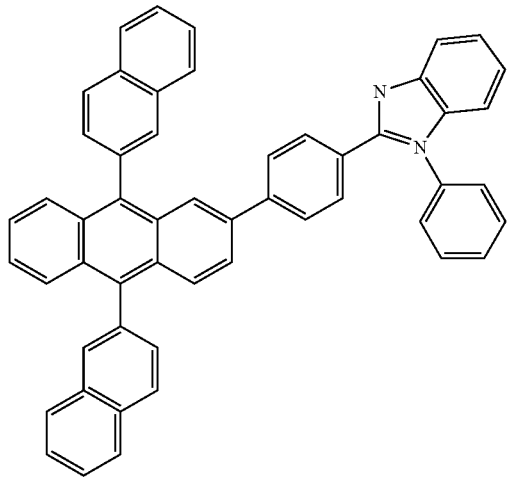

-continued

[Chemical Formula 102]

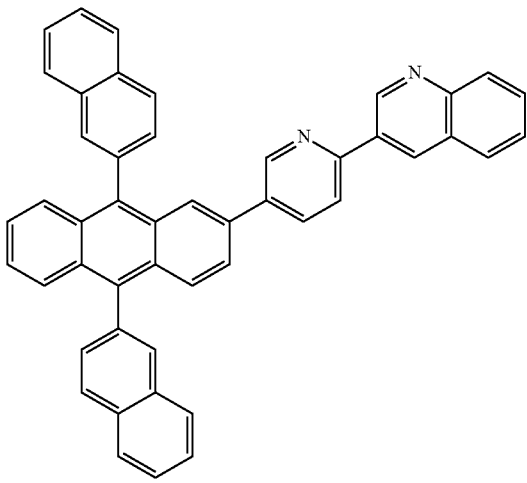

The metal-containing material may include a Li complex. Non-limiting examples of the Li complex include lithium quinolate (LiQ) or a compound represented by Chemical Formula 103, but embodiments of the invention are not limited thereto.

Chemical Formula 103

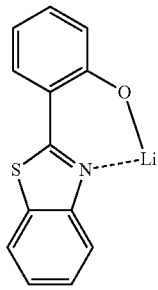

The ETL 40 may be formed on the emission layer 50 by using various methods such as a vacuum deposition method, a spin coating method, a casting method, and the like. When the ETL 40 is formed by using the vacuum deposition method or the spin coating method, the conditions may be varied depending on a compound that is used to form the ETL.

The emission layer 50 may contain a compound represented by Chemical Formula 2.

Chemical Formula 2

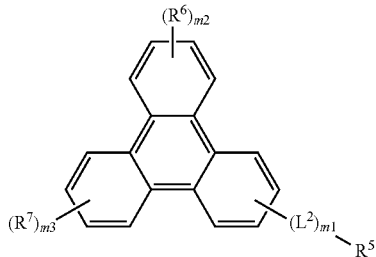

In Chemical Formula 2, $L^2$ may be a substituted or unsubstituted C6 to C30 arylene group or a substituted or unsubstituted C2 to C30 heteroarylene group, $R^5$ may be selected from a hydrogen atom, a substituted or unsubstituted C6 to C30 aryl group, a substituted or unsubstituted C1 to C30 heteroaryl group, a substituted or unsubstituted C1 to C30 amine group, or a substituted or unsubstituted silyl group; $R^6$ and $R^7$ may each independently be selected from a hydrogen atom, a heavy hydrogen atom, a substituted or unsubstituted C1 to C30 alkyl group, a substituted or unsubstituted C3 to C30 cycloalkyl group, a substituted or unsubstituted C6 to C30 aryl group, a substituted or unsubstituted C1 to C30 heteroaryl group, a substituted or unsubstituted C1 to C30 amine group or a substituted or unsubstituted silyl group; m1 may be an integer ranging from 0 to 2; and m2 and m3 may each independently be integers ranging from 0 to 3.

In some embodiments, the compound represented by Chemical Formula 2 has a triphenylene structure, which has high affinity for both electrons and electron holes. Additionally, the compound of Chemical Formula 2 has a rigid fully aromatic structure, and thereby may obtain high thermostability. In some embodiments, an organic light emitting diode device including the compound of Chemical Formula 2 may have high efficiency and a long life-span due to a high balance between the electrons and the electron holes within the emission layer.

In some embodiments, $L^2$ may be a substituted or unsubstituted C6 to C30 arylene group, $R^5$ may be selected from a hydrogen atom, a substituted or unsubstituted C6 to C30 aryl group, a substituted or unsubstituted C1 to C30 heteroaryl group, a substituted or unsubstituted C1 to C30 amine group, or a substituted or unsubstituted silyl group; m1 may be an integer ranging from 0 to 2; and m2 and m3 may be 0. Resulting organic light emitting diode device may have improved efficiency and life-span.

In an exemplary embodiment, $L^2$ may be a substituted or unsubstituted phenylene group or a substituted or unsubstituted naphthylene group. In this case, it may be possible to adjust hole and/or electron characteristics of the compound.

The compound represented by Chemical Formula 2 may be represented by one of Chemical Formulae 2-1 to 2-24.

[2-1]

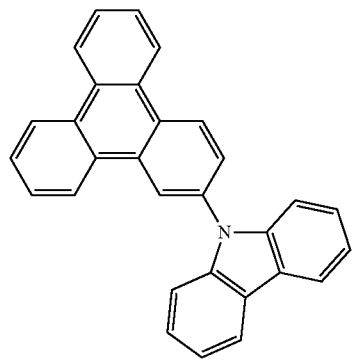

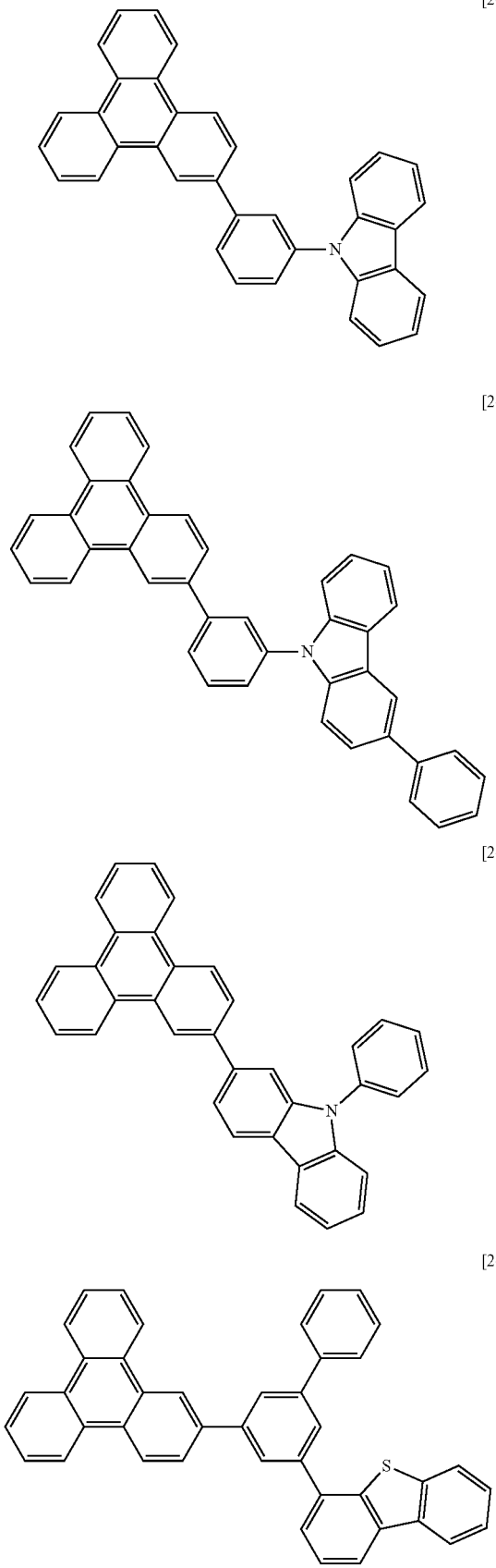
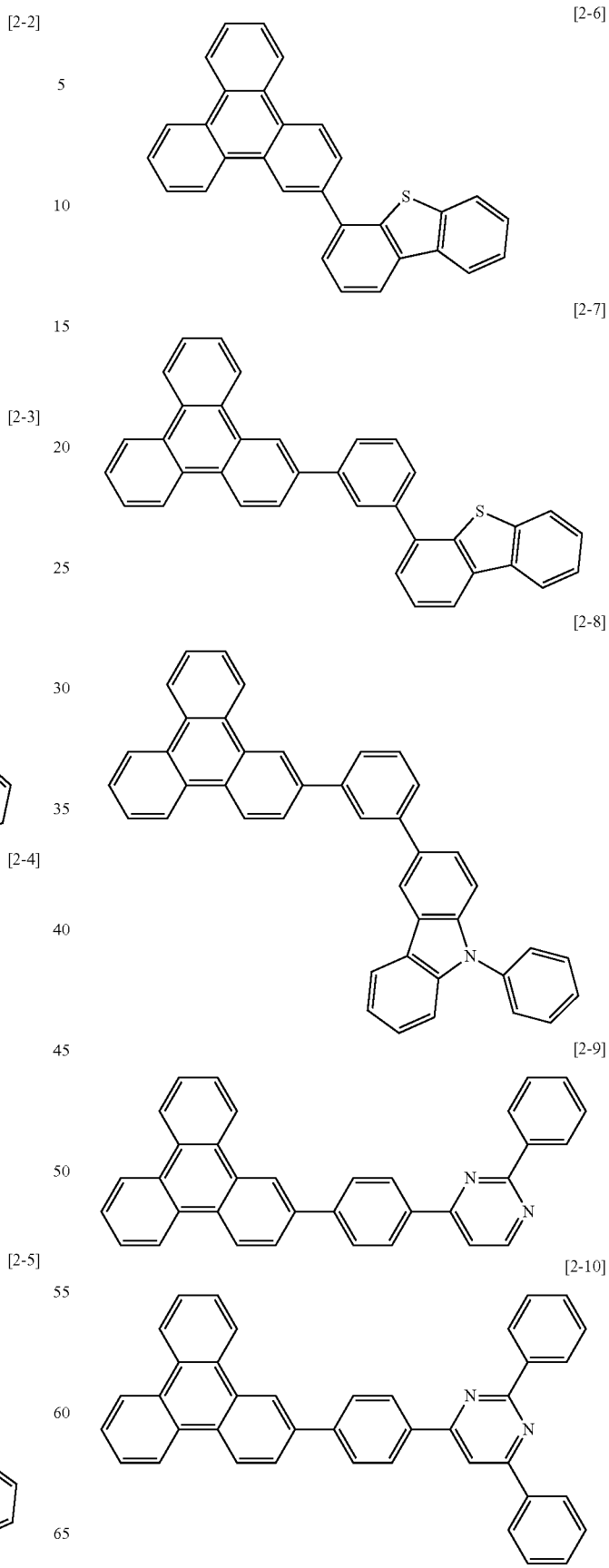

[2-11]
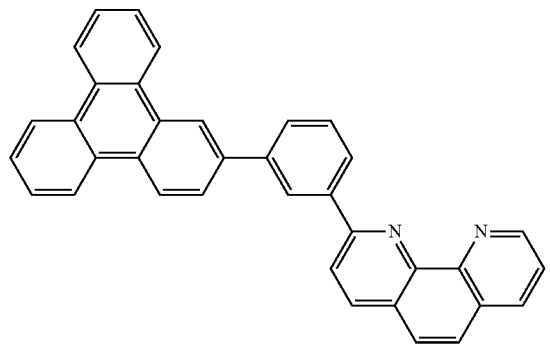
[2-12]
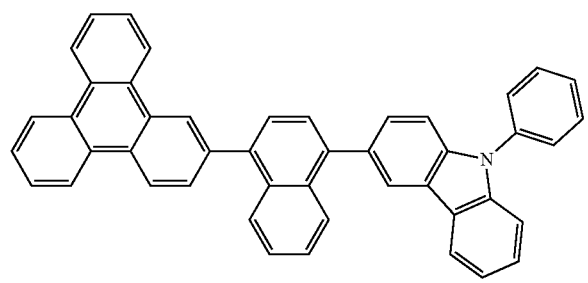
[2-13]
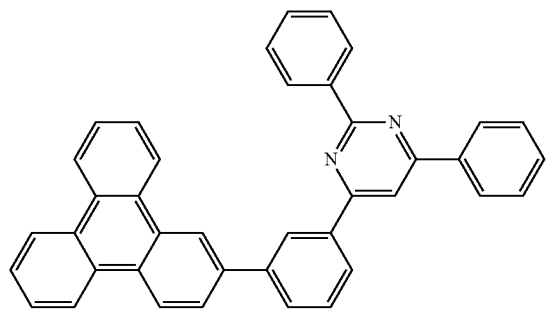
[2-14]
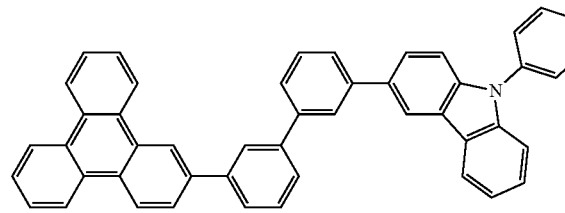
[2-15]
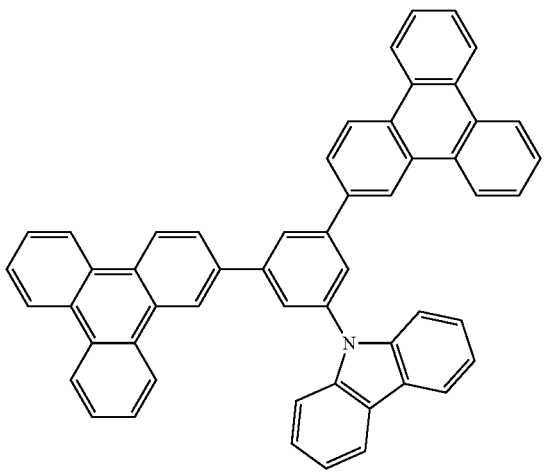
[2-16]
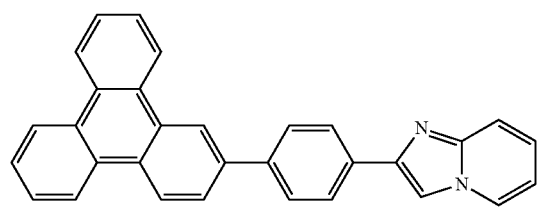
[2-17]
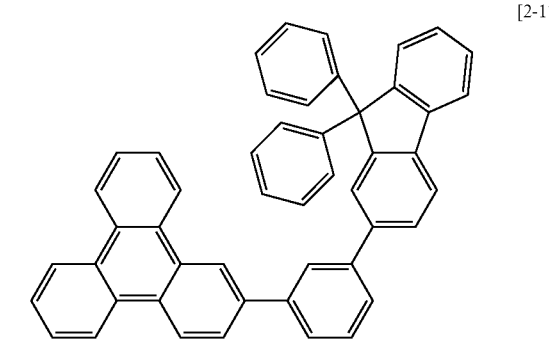
[2-18]
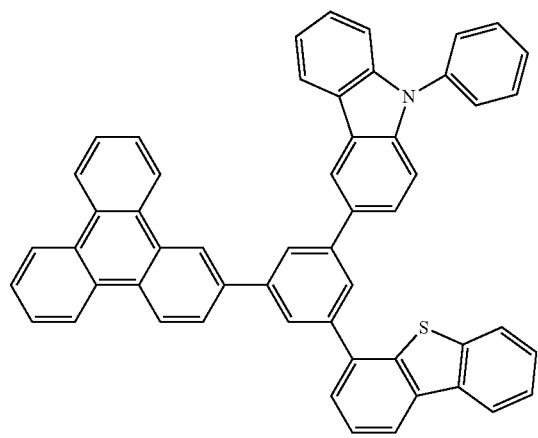

[2-19]
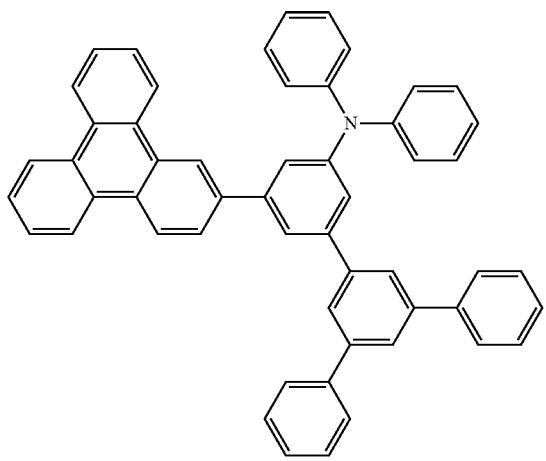

[2-20]
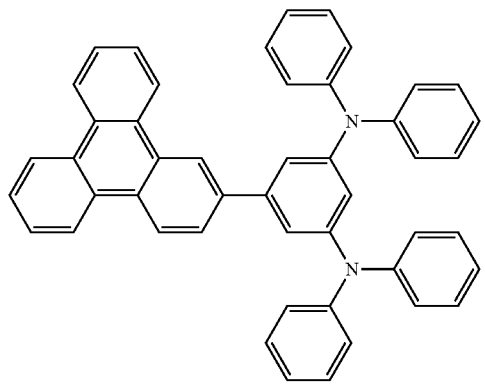

[2-21]
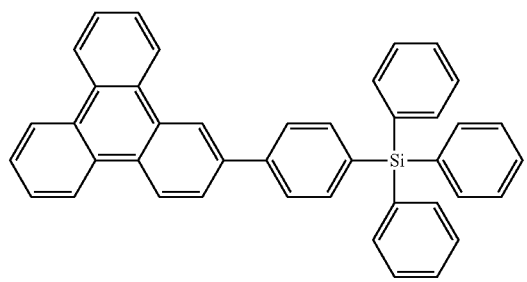

[2-22]
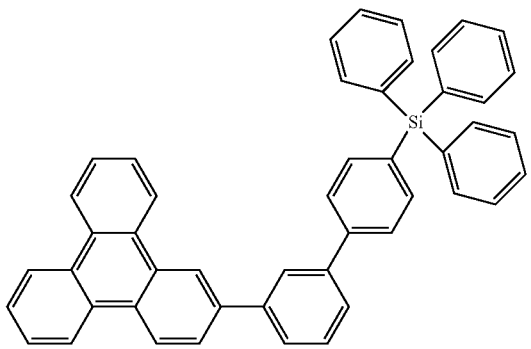

[2-23]
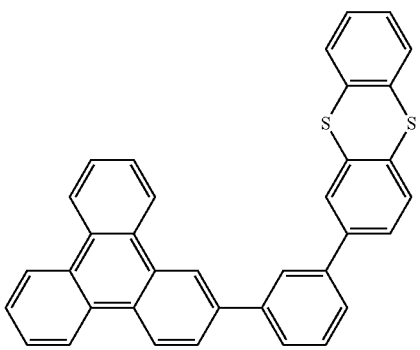

[2-24]
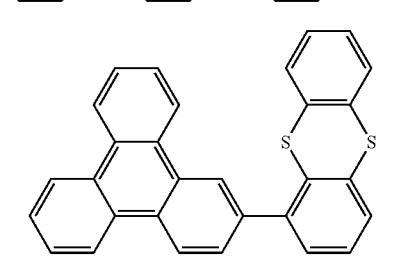

In some embodiments, the balance between the hole mobility and the electron mobility in the organic light emitting diode device is improved by including the ETL 40 containing the compound represented by Chemical Formula 1 and the emission layer 50 containing the compound represented by Chemical Formula 2, thereby increasing electrochemical stability. In some embodiments, it may be possible to simultaneously obtain satisfactory luminous efficiency and life-span of the organic light-emitting diode device.

The emission layer 50 may contain the compound represented by Chemical Formula 2 as a host material. The emission layer 50 may further contain a dopant material, and the dopant material may be, for example, a phosphorescent dopant material. In the embodiments where the emission layer further contains the dopant material, the electrochemical stability of the organic light emitting diode device may be improved and the luminous efficiency may be increased, thereby reducing current density of the organic light emitting diode device. Accordingly, when the organic light emitting diode device is operated, a load thereof may be reduced, and its life-span may be increased.

Non-limiting examples of a red dopant suitable for use in organic light emitting diode devices include PtOEP, Ir(piq)$_3$, Btp$_2$Ir(acac), DCJTB, and the like, but are not limited thereto.

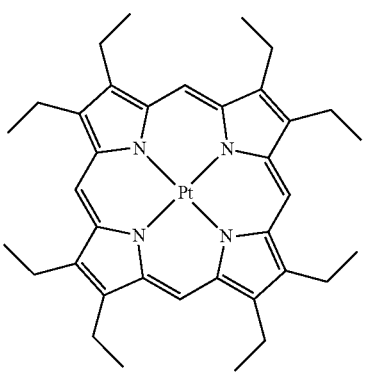

PtOEP

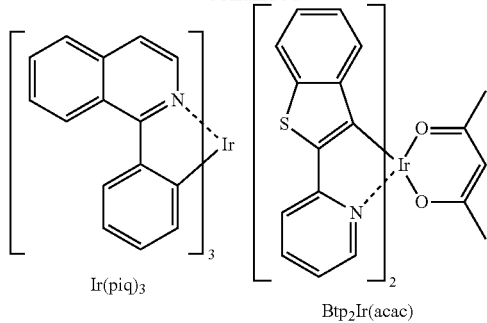

Ir(piq)₃

Btp₂Ir(acac)

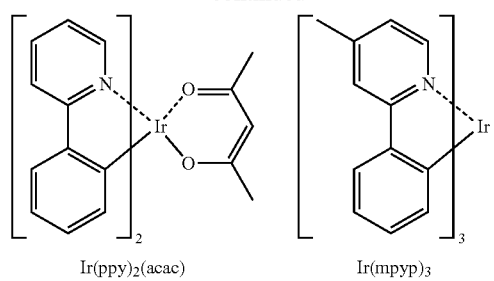

Ir(ppy)₂(acac)

Ir(mpyp)₃

Non-limiting examples of a green dopant suitable for use in organic light emitting diode devices include Ir(ppy)₃ (ppy=phenyl), Ir(ppy)₂(acac), Ir(mpyp)₃, C545T, and the like, but are not limited thereto.

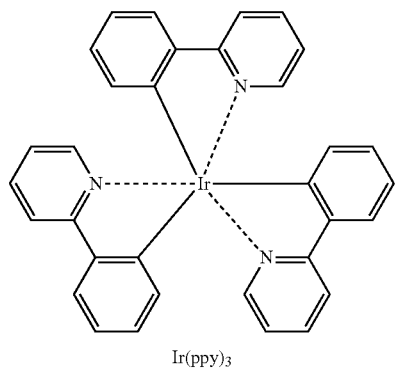

Ir(ppy)₃

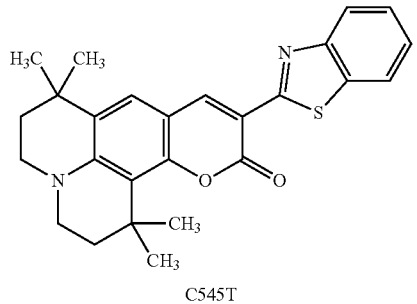

C545T

Non-limiting examples of a blue dopant suitable for use in organic light emitting diode devices include F₂Irpic, (F₂ppy)₂Ir(tmd), Ir(dfppz)₃, ter-fluorene, 4,4'-bis(4-diphenylaminostyryl)biphenyl(DPAVBi), 2,5,8,11-tetra-tert-butyl perylene (TBP), and the like, but are not limited thereto.

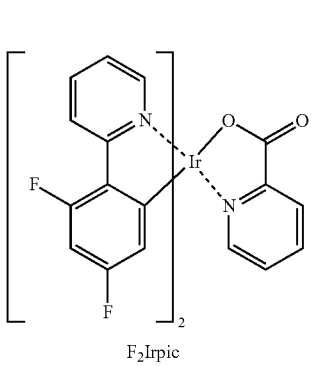

F₂Irpic

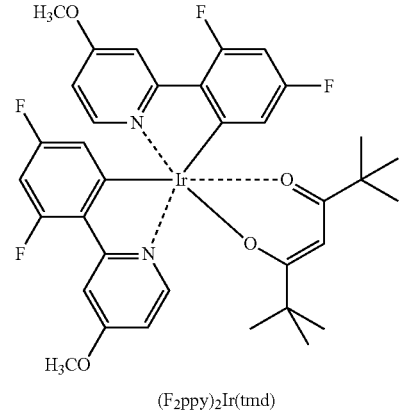

(F₂ppy)₂Ir(tmd)

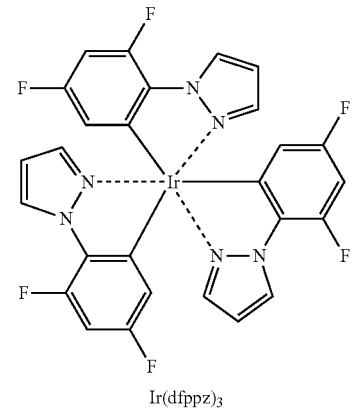

Ir(dfppz)₃

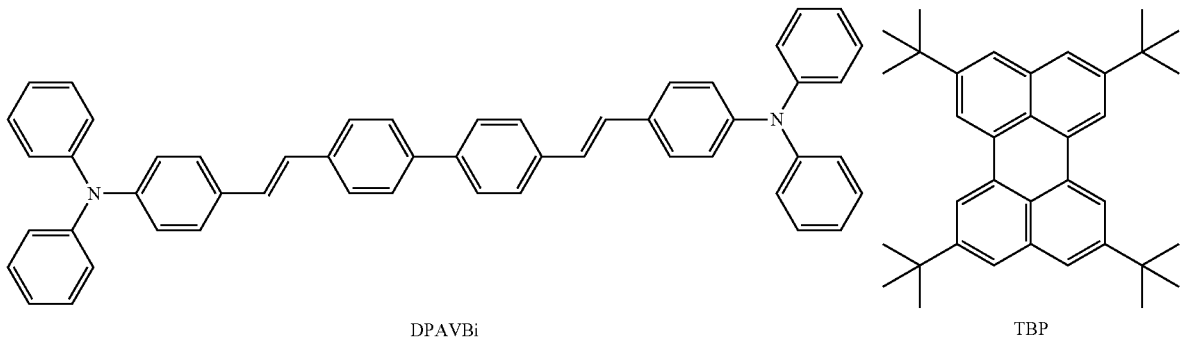

DPAVBi

TBP

The host material may be contained in a higher content than that of the dopant material. In some embodiments, the host material and the dopant material may be contained in a weight ratio ranging from about 6:4 to about 9:1.

The HTL 30 may contain any hole transport material suitable for use in organic light emitting diode devices, and non-limiting examples of the hole transport material include a carbazole derivative such as N-phenylcarbazole, polyvinylcarbazole, or the like, and an amine derivative having an aromatic condensed ring such as NPB, N,N'-bis(3-methylphenyl)-N,N'-diphenyl-[1,1-biphenyl]-4,4'-diamine (TPD), tris(4-carbazoyl-9-ylphenyl)amine (TCTA), or the like. For example, in embodiments where TCTA is included, the HTL 30 may serve to perform not only a hole transport operation but also an operation for preventing diffusion of excitons from the emission layer.

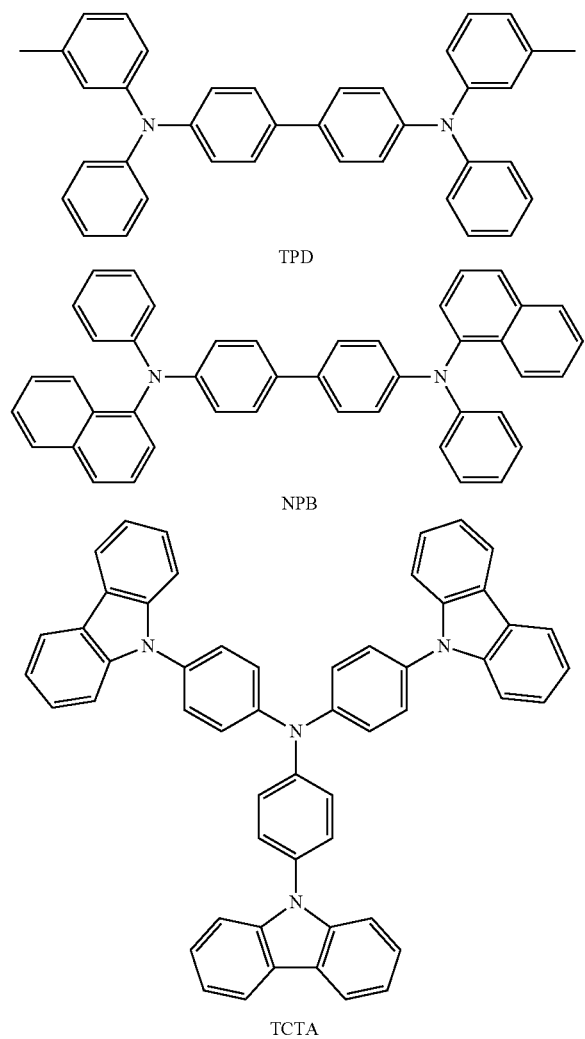

The HTL 30 may be formed by using various methods such as a vacuum deposition method, a spin coating method, a casting method, an LB method, and the like. When the HTL 30 is formed by using the vacuum deposition method or the spin coating method, the deposition conditions and the coating conditions may be varied depending on a compound that is used to form the HTL.

The HTL 30 may further contain an auxiliary material to improve film conductivity and the like.

The auxiliary material may be, for example, a p-dopant. Non-limiting examples of the p-dopant include a quinone derivative such as tetracyanoquinodimethane (TCNQ) and 2,3,5,6-tetrafluoro-tetracyano-1,4-benzoquinonedimethane (F4TCNQ) or the like; a metal oxide such as tungsten oxide and molybdenum oxide; and a cyano group-containing compound such as a compound represented by Chemical Formula 100, but embodiments of the invention are not limited thereto.

Chemical Formula 100

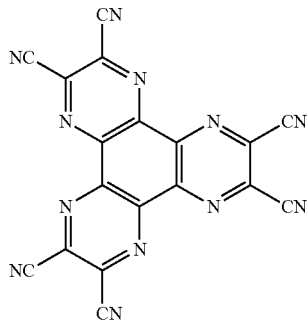

When the HTL 30 further contains the auxiliary material, the auxiliary material may be non-uniformly distributed or uniformly dispersed over the layers.

Hereinafter, referring to FIG. 2, an organic light emitting diode device will be described in accordance with embodiments of the present invention.

Figure 2:
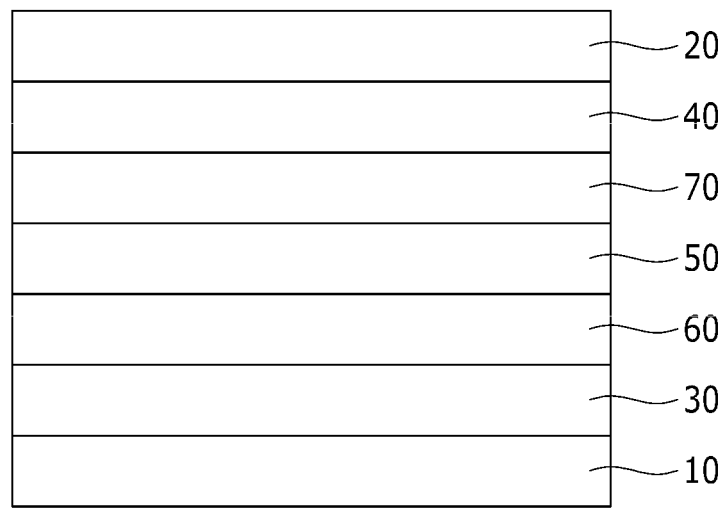

Referring to FIG. 2, the organic light emitting diode device includes an anode 10 and a cathode 20 facing the anode 10; an emission layer 50 positioned between the anode 10 and the cathode 20; a hole transport layer (HTL) 30 positioned between the anode 10 and the emission layer 50; and an electron transport layer (ETL) 40 positioned between the cathode 20 and the emission layer 50.

The organic light emitting diode device of the present exemplary embodiment further includes a hole injection layer (HIL) 60 positioned between the anode 10 and the HTL 30, and an electron injection layer (EIL) 70 positioned between the emission layer 50 and the ETL 40.

The HIL 60 may contain any hole injection material suitable for use in organic light emitting diode devices. Non-limiting examples of the hole injection material include a phthalocyanine compound such as copper phthalocyanine or the like, m-MTDATA (4,4',4"-tris(3-methylphenylphenylamino)triphenylamine), NPB (N,N'-di(1-naphthyl)-N,N'-diphenylbenzidine(N,N'-di(1-naphthyl)-N,N'-diphenylbenzidine)), TDATA, 2T-NATA, Pani/DBSA (polyaniline/dodecylbenzene sulfonic acid:polyaniline/dodecylbenzene sulfonic acid), PEDOT/PSS (poly(3,4-ethylene dioxythiophene)/poly(4-styrene sulfonate):poly(3,4-ethylene dioxythiophene)/poly(4-styrene sulfonate)), Pani/CSA (polyaniline/camphor sulfonic acid:polyaniline/camphor sulfonic acid), or PANI/PSS ((polyaniline)/poly(4-styrene sulfonate): polyaniline)/poly(4-styrene sulfonate)), but embodiments of the invention are not limited thereto.

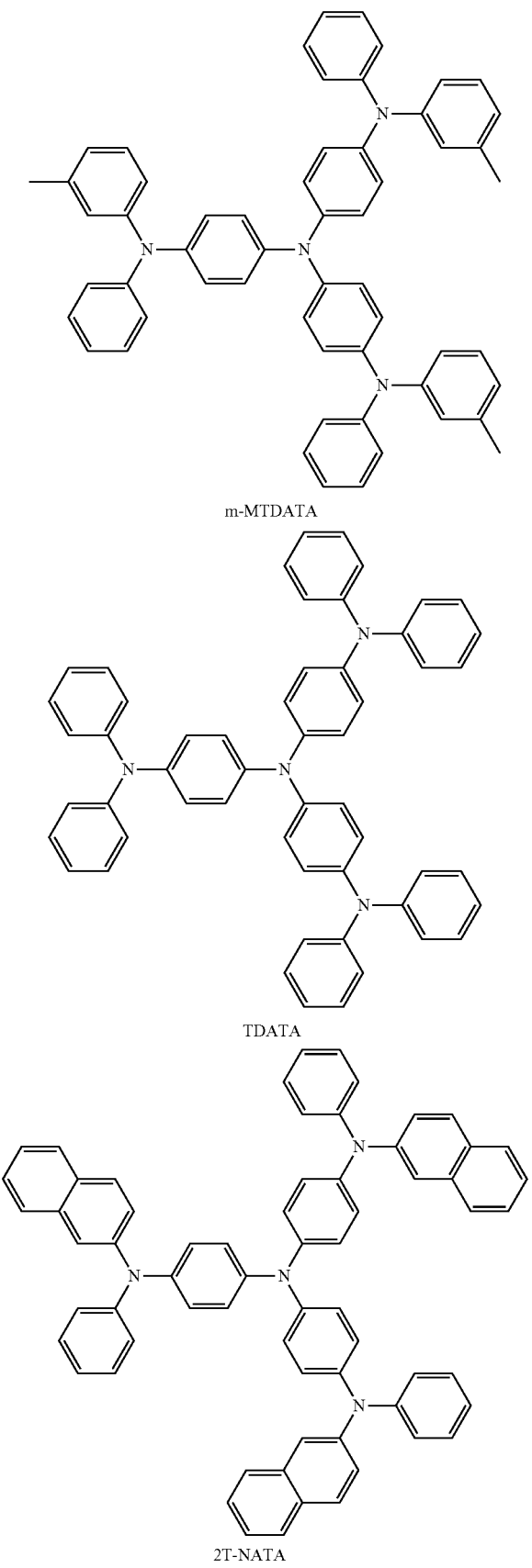

m-MTDATA

TDATA

2T-NATA

The HIL 60 may further contain the aforementioned auxiliary material to improve film conductivity and the like.

When the HIL 60 further contains the auxiliary material, the auxiliary material may be non-uniformly distributed or uniformly dispersed over the layers.

The HIL 60 may be formed by using various methods such as a vacuum deposition method, a spin coating method, a casting method, an LB method, and the like.

When the HIL 60 is formed by using the vacuum deposition method, the deposition conditions may be varied depending on a compound used to form the HIL, a desired structure of the HIL, a thermal characteristic, and the like. In some embodiments, a vacuum deposition temperature may be in the range from about 100 to about 500° C., a vacuum level may be in the range from about $10^{-8}$ to about $10^{-3}$ torr, and a vacuum deposition rate may be in the range from about 0.01 to about 100 Å/sec.

When the HIL 60 is formed by using the spin coating method, the coating conditions may be varied depending on a compound used to form the HIL, a desired structure of the HIL, a thermal characteristic, and the like. In some embodiments, a coating rate may be in the range from about 2000 rpm to about 5000 rpm, and a heat treatment temperature for solvent removal after coating may be in the range from about 80 to about 200° C.

When the emission layer 50 contains a phosphorescent dopant, a hole blocking layer (not shown) may be formed on the emission layer 50 to prevent the diffusion of triplet excitons or holes into the ETL. Any hole blocking material suitable for use in organic light-emitting diode devices may be used. Non-limiting examples of the hole blocking material include an oxadiazole derivative, a triazole derivative, a phenanthroline derivative, Balq, BCP, and the like.

The EIL 70 may be formed on the ETL 40 to serve as a material for facilitating the injection of electrons from a cathode.

Any electron injection material suitable for use in organic light emitting devices can be used to form the EIL 70, and non-limiting examples include LiF, NaCl, CsF, $Li_2O$, BaO, or the like. The vacuum deposition conditions and the coating conditions are varied depending on the compound that is used to form the EIL. In some embodiments, selections are made in a condition range that is substantially the same as the condition range for the formation of the HIL 60.

The emission layer 50 may also formed by using various methods such as a vacuum deposition method, a spin coating method, a casting method, an LB method, and the like, but embodiments of the invention are not limited thereto.

In some embodiments, the organic light emitting diode device may have a structure selected from anode/HIL/emission layer/cathode, anode/HIL/HTL/emission layer/ETL/cathode, anode/HTL/emission layer/ETL/cathode, and HIL/HTL/emission layer/ETL/EIL/cathode. In alternative embodiments, the organic light emitting diode device may have a structure of anode/functional layer having both hole injecting function and hole transport function/emission layer/ETL/cathode, or anode/functional layer having both hole injecting function and hole transport function/emission layer/ETL/EIL/cathode. In further embodiments, the organic light emitting diode device may have a structure selected from HTL/emission layer/functional layer having both hole injecting function and hole transport function/cathode, anode/HIL/emission layer/functional layer having both hole injecting function and hole transport function/cathode, and anode/HIL/HTL/emission layer/functional layer having both hole injecting function and hole transport function/cathode, but embodiments of the invention are not limited thereto.

The organic light emitting diode device in accordance with embodiments of the present invention can be applied in various structures such as a top light emission type, a bottom light emission type, a both-side emission type, and the like.

The organic light emitting diode device in accordance with embodiments of the present invention may be used in various types of flat panel displays, such as a passive matrix OLED display and an active matrix OLED display. When the organic light emitting diode device is used in the active matrix OLED display, a lower electrode may serve as a pixel electrode and be electrically connected to a thin film transistor. A first layer of the organic light emitting diode device in accordance with embodiments of the present invention may be formed by using the vacuum deposition method using the organic compound of the embodiments of the present application or a wet processing method of coating the organic compound of the embodiments of the present invention.

Hereinafter, the present invention will be described in detail with reference to a comparative example and test examples. The following examples are merely described for the purpose of explanation, without limiting the scope of the present invention.

TEST EXAMPLES

Test Example 1-1

For the anode, a 15 Ω/cm² 500 Å ITO glass substrate available from Dow Corning Corporation was cut to dimensions of 50 mm×50 mm×0.5 mm and was subjected to an ultrasonic wave cleaning process for about one minute using isopropyl alcohol and pure water, and ultraviolet ray irradiation for about one minute. Then, the glass substrate was exposed to ozone to be cleaned and installed in a vacuum deposition apparatus.

First, 2-TNATA (Luminescence Technology Corp.) was subjected to vacuum deposition to form an HIL having a thickness of 600 Å on top of the substrate. Then, 4,4'-bis[N-(1-naphthyl)-N-phenylamino]piphenyl (hereinafter, NPB) (Luminescence Technology Corp.), serving as a hole transport compound, was subjected to vacuum deposition to form an HTL having a thickness of 300 Å.

CBP, serving as a host, and bis-(1-phenylisoquinolyl)iridium(III) acetylacetonate (hereinafter, Ir(ppy)₃ (Luminescence Technology Corp.)), serving as a green phosphorescent dopant, were simultaneously subjected to vacuum deposition in a weight ratio of 85:15 to form an emission layer having a thickness of 400 Å on top of the HTL. Subsequently, the compound represented by Chemical Formula 1-1 was subjected to vacuum deposition to form an ETL having a thickness of 300 Å on top of the emission layer. Thereafter, Al was subjected to vacuum deposition to form a cathode electrode having a thickness of 1200 Å, thereby manufacturing an organic light emitting diode device.

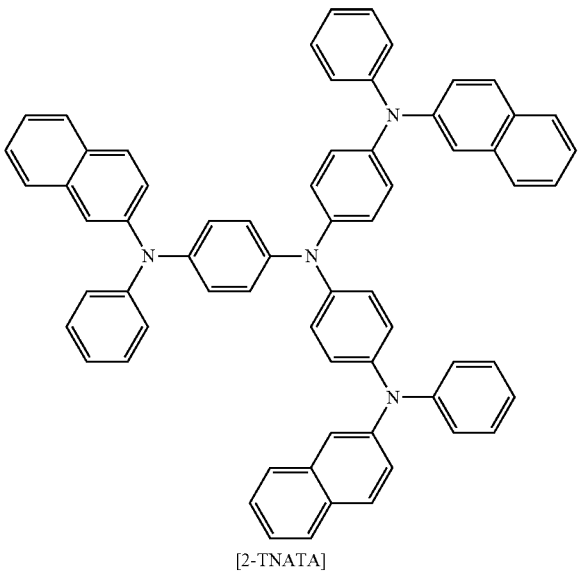

[2-TNATA]

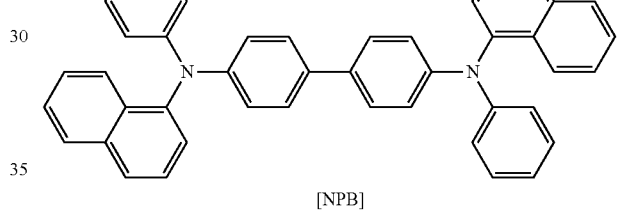

[NPB]

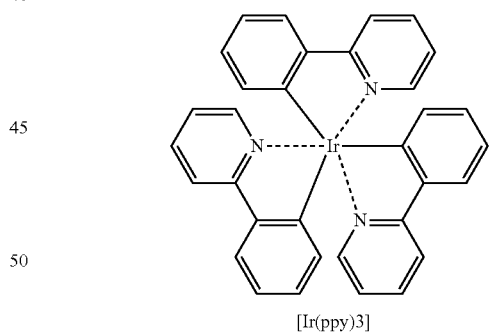

[Ir(ppy)3]

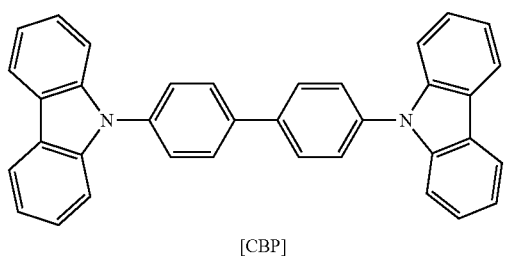

[CBP]

-continued

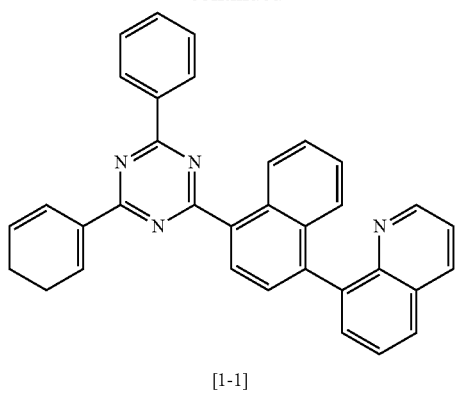

[1-1]

Test Example 1-2

An organic light emitting diode device was manufactured by using substantially the same method as that of Test Example 1-1, except that Chemical Formula 1-6 was employed to form the ETL instead of Chemical Formula 1-1.

Test Example 1-3

An organic light emitting diode device was manufactured by using substantially the same method as that of Test Example 1-1, except that Chemical Formula 1-7 was employed to form the ETL instead of Chemical Formula 1-1.

Comparative Example 1

An organic light emitting diode device was manufactured by using substantially the same method as that of Test Example 1-1, except that Alq3 (Luminescence Technology Corp.) was employed to form the ETL instead of Chemical Formula 1-1.

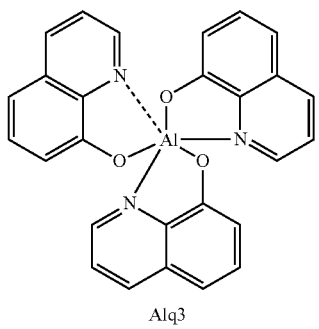

Alq3

Evaluation

The characteristics of the organic light emitting diode device according to Test Examples 1-1 to 1-3 and Comparative Example 1 were evaluated. The efficiency was measured by using Keithley 2635A and TOPCON CROMA METER SR-3AR, and efficiency values were obtained when the luminance reached 9000 nit at room temperature. The organic light emitting diode device has a light emitting area of 2×2 mm.

The results are shown in Table 1.

TABLE 1

| | Host material | Electron transport material | Efficiency (cd/A) |
|---|---|---|---|
| Test Example 1-1 | CBP | 1-1 | 84 |
| Test Example 1-2 | CBP | 1-6 | 71 |
| Test Example 1-3 | CBP | 1-7 | 64 |
| Comparative Example 1 | CBP | Alq3 | 43 |

Referring to Table 1, the efficiencies of the organic light emitting diode devices according to Test Examples 1-1 to 1-3 are significantly better than the efficiencies of the organic light emitting diode device according to Comparative Example 1, using CBP as a host material of the emission layer and Alq3 as an electron transport material.

Test Example 2-1

For the anode, a 15 Å/cm² 500 Å ITO glass substrate available from Dow Corning Corporation was cut to dimensions of 50 mm×50 mm×0.5 mm and was subjected to an ultrasonic wave cleaning process for about one minute by using isopropyl alcohol and pure water, and ultraviolet ray irradiation for about one minute. Then, the glass substrate was exposed to ozone to be cleaned and installed in a vacuum deposition apparatus.

First, 2-TNATA (Luminescence Technology Corp.), was subjected to vacuum deposition to form an HIL having a thickness of 600 Å on top of the substrate. Then, 4,4'-bis [N-(1-naphthyl)-N-phenylamino]biphenyl (hereinafter, NPB) (Luminescence Technology Corp.), serving as a hole transport compound was subjected to vacuum deposition to form an HTL having a thickness of 300 Å.

The compound represented by Chemical Formula 2-1, serving as a host, and bis-(1-phenylisoquinolyl)iridium(III) acetylacetonate (hereinafter, Ir(ppy)3 (Luminescence Technology Corp.)), serving as a green phosphorescent dopant, were simultaneously subjected to vacuum deposition at a weight ratio of 85:15 to form an emission layer having a thickness of 400 Å on top of the HTL. Subsequently, the compound represented by Chemical Formula 1-1 was subjected to vacuum deposition to form an ETL having a thickness of 300 Å on top of the emission layer. Thereafter, Al was subjected to vacuum deposition to form a cathode electrode having a thickness of 1200 Å, thereby manufacturing an organic light emitting diode device.

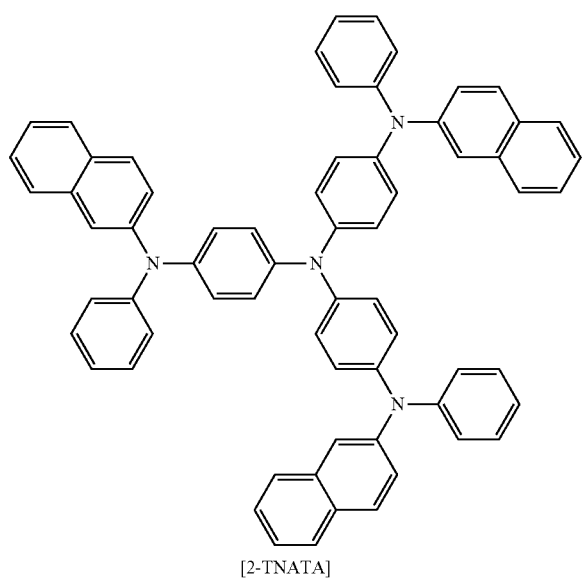

[2-TNATA]

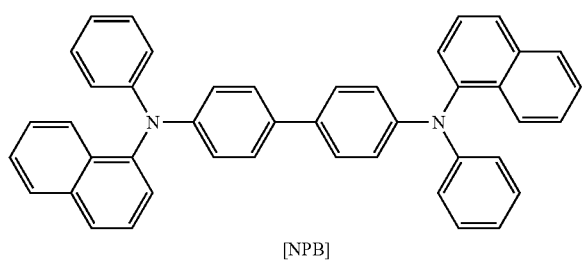

[NPB]

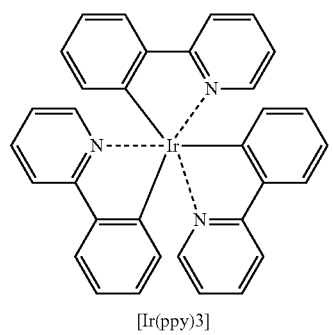

[Ir(ppy)3]

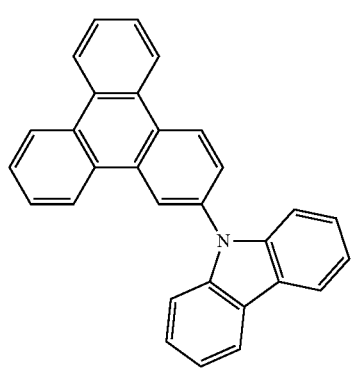

[2-1]

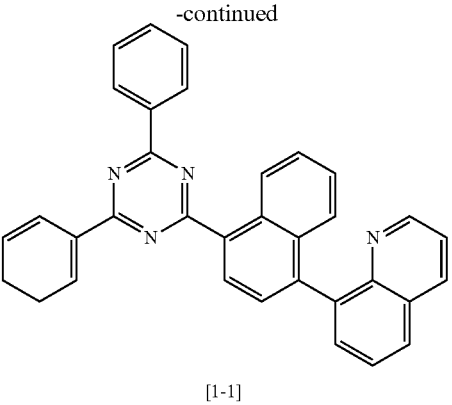

[1-1]

Test Example 2-2

An organic light emitting diode device was manufactured by using substantially the same method as that of Test Example 2-1, except that Chemical Formula 2-2 was employed to form the emission layer instead of Chemical Formula 2-1.

Test Example 2-3

An organic light emitting diode device was manufactured by using substantially the same method as that of Test Example 2-1, except that Chemical Formula 2-6 was employed to form the emission layer instead of Chemical Formula 2-1.

Test Example 2-4

An organic light emitting diode device was manufactured by using substantially the same method as that of Test Example 2-1, except that Chemical Formula 2-7 was employed to form the emission layer instead of Chemical Formula 2-1.

Test Example 2-5

An organic light emitting diode device was manufactured by using substantially the same method as that of Test Example 2-1, except that Chemical Formula 1-2 was employed to form the ETL instead of Chemical Formula 1-1.

Test Example 2-6

An organic light emitting diode device was manufactured by using substantially the same method as that of Test Example 2-5, except that Chemical Formula 2-2 was employed to form the emission layer instead of Chemical Formula 2-1.

Test Example 2-7

An organic light emitting diode device was manufactured by using substantially the same method as that of Test Example 2-5, except that Chemical Formula 2-6 was employed to form the emission layer instead of Chemical Formula 2-1.

Test Example 2-8

An organic light emitting diode device was manufactured by using substantially the same method as that of Test Example 2-5, except that Chemical Formula 2-7 was employed to form the emission layer instead of Chemical Formula 2-1.

Test Example 2-9

An organic light emitting diode device was manufactured by using substantially the same method as that of Test Example 2-1, except that Chemical Formula 1-6 was employed to form the ETL instead of Chemical Formula 1-1.

Test Example 2-10

An organic light emitting diode device was manufactured by using substantially the same method as that of Test Example 2-9, except that Chemical Formula 2-2 was employed to form the emission layer instead of Chemical Formula 2-1.

Test Example 2-11

An organic light emitting diode device was manufactured by using substantially the same method as that of Test Example 2-9, except that Chemical Formula 2-6 was employed to form the emission layer instead of Chemical Formula 2-1.

Test Example 2-12

An organic light emitting diode device was manufactured by using substantially the same method as that of Test Example 2-1, except that Chemical Formula 1-7 was employed to form the ETL instead of Chemical Formula 1-1.

Test Example 2-13

An organic light emitting diode device was manufactured by using substantially the same method as that of Test Example 2-12, except that Chemical Formula 2-2 was employed to form the emission layer instead of Chemical Formula 2-1.

Test Example 2-14

An organic light emitting diode device was manufactured by using substantially the same method as that of Test Example 2-12, except that Chemical Formula 2-6 was employed to form the emission layer instead of Chemical Formula 2-1.

Evaluation

The characteristics of the organic light emitting diode device according to Test Examples 2-1 to 2-14 and Comparative Example 1 were evaluated.

The results are shown in Table 2.

TABLE 2

| | Host material | Electron transport material | Efficiency (cd/A) | Life-span (Hr) (T97%) |
|---|---|---|---|---|
| Test Example 2-1 | 2-1 | 1-1 | 95 | 100 |
| Test Example 2-2 | 2-2 | 1-1 | 94 | 124 |
| Test Example 2-3 | 2-6 | 1-1 | 97 | 115 |
| Test Example 2-4 | 2-7 | 1-1 | 101 | 146 |
| Test Example 2-5 | 2-1 | 1-2 | 94 | 135 |
| Test Example 2-6 | 2-2 | 1-2 | 94 | 122 |
| Test Example 2-7 | 2-6 | 1-2 | 88 | 105 |
| Test Example 2-8 | 2-7 | 1-2 | 92 | 115 |
| Test Example 2-9 | 2-1 | 1-6 | 83 | 224 |
| Test Example 2-10 | 2-2 | 1-6 | 81 | 198 |
| Test Example 2-11 | 2-6 | 1-6 | 86 | 205 |
| Test Example 2-12 | 2-1 | 1-7 | 89 | 207 |
| Test Example 2-13 | 2-2 | 1-7 | 93 | 224 |
| Test Example 2-14 | 2-6 | 1-7 | 90 | 190 |
| Comparative Example 1 | CBP | Alq3 | 43 | 14 |

In Table 2, T97% indicates a time (H) that it takes for the luminance to drop to 97% when all the organic light emitting diode devices are driven by setting their initial luminance to 9000 nit as 100% while continuously supplying each current A that is required to embody the initial luminance of 9000 nit.

Referring to Table 2, the efficiency and life-span characteristics of the organic light emitting diode devices according to Test Examples 2-1 to 2-14 are significantly better than the efficiency and life-span characteristics of the organic light emitting diode device according to Comparative Example 1, using CBP as a host material of the emission layer and Alq3 as an electron transport material.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and equivalents thereof.

What is claimed is:

1. An organic light emitting diode device comprising:
    an anode;
    a cathode facing the anode;
    an emission layer between the anode and the cathode; and
    an electron transport layer (ETL) between the cathode and the emission layer,
    where the ETL comprises a compound represented by Chemical Formula 1, and the emission layer comprises a compound represented by Chemical Formula 2 as a host material:

Chemical Formula 1

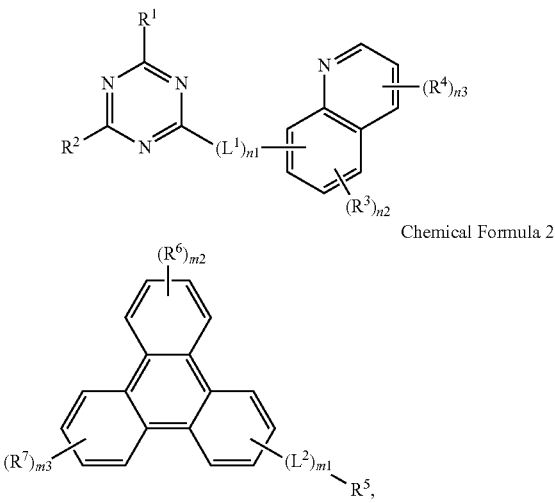

Chemical Formula 2 wherein, in Chemical Formula 1, $L^1$ is a substituted or unsubstituted C6 to C30 arylene group or a substituted or unsubstituted C2 to C30 heteroarylene group, $R^1$ to $R^4$ are each independently selected from the group consisting of a hydrogen atom, a heavy hydrogen atom, a substituted or unsubstituted C1 to C30 alkyl group, a substituted or unsubstituted C3 to C30 cycloalkyl group, a substituted or unsubstituted C6 to C30 aryl group, a substituted or unsubstituted C1 to C30 heteroaryl group, a substituted or unsubstituted C1 to C30 amine group, and a substituted or unsubstituted silyl group, n1 is an integer ranging from 0 to 2, and n2 and n3 are each independently integers ranging from 0 to 3; and wherein, in Chemical Formula 2, $L^2$ is a substituted or unsubstituted C6 to C30 arylene group or a substituted or unsubstituted C2 to C30 heteroarylene group, $R^5$ is selected from the group consisting of a hydrogen atom, a substituted or unsubstituted C6 to C30 aryl group, a substituted or unsubstituted C1 to C30 heteroaryl group, a substituted or unsubstituted C1 to C30 amine group, and a substituted or unsubstituted silyl group, $R^6$ and $R^7$ are each independently selected from the group consisting of a hydrogen atom, a heavy hydrogen atom, a substituted or unsubstituted C1 to C30 alkyl group, a substituted or unsubstituted C3 to C30 cycloalkyl group, a substituted or unsubstituted C6 to C30 aryl group, a substituted or unsubstituted C1 to C30 heteroaryl group, a substituted or unsubstituted C1 to C30 amine group, and a substituted or unsubstituted silyl group, m1 is an integer ranging from 0 to 2, and m2 and m3 are each independently integers ranging from 0 to 4, wherein the compound represented by Chemical Formula 1 excludes the following compounds:

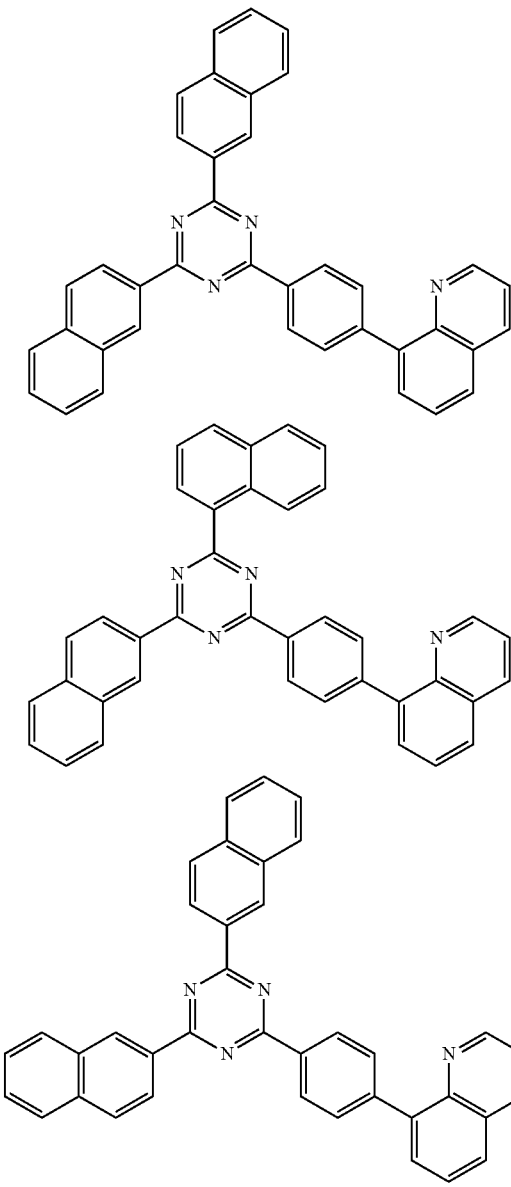

2. The organic light emitting diode device of claim 1, wherein $R^1$ and $R^2$ are each independently a hydrogen atom, or a substituted or unsubstituted C6 to C30 aryl group, $L^1$ is a substituted or unsubstituted C6 to C30 arylene group, n1 is 1, and n2 and n3 are each 0.

3. The organic light emitting diode device of claim 2, wherein $L^1$ is a substituted or unsubstituted phenylene group or a substituted or unsubstituted naphthylene group.

4. The organic light emitting diode device of claim 1, wherein the compound represented by Chemical Formula 1 is represented by one of Chemical Formulae 1-1 to 1-5:

[1-1]
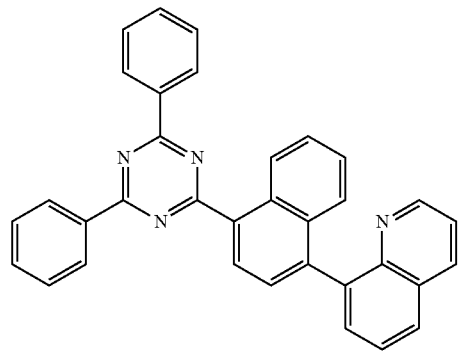

[1-2]
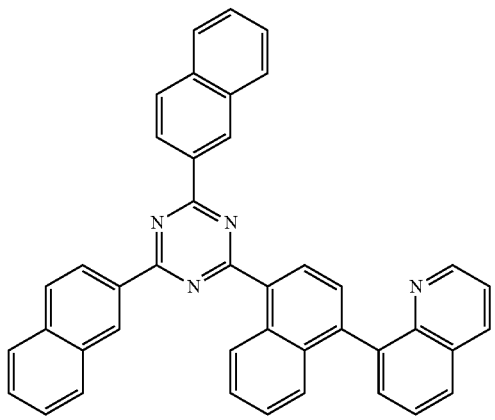

[1-3]

[1-4]
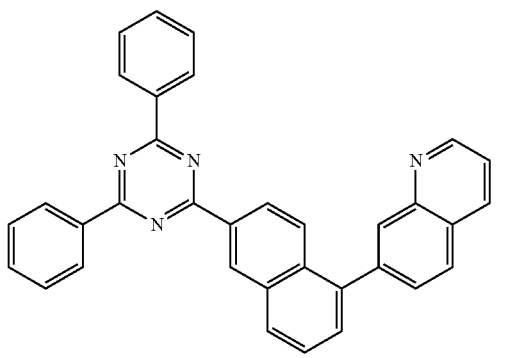

[1-5]
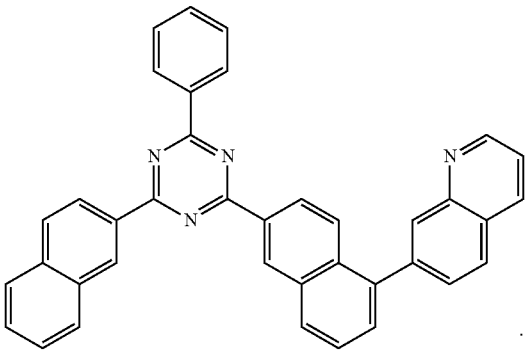

5. The organic light emitting diode device of claim 1, wherein
L² is a substituted or unsubstituted C6 to C30 arylene group,
R⁵ is selected from the group consisting of a hydrogen atom, a substituted or unsubstituted C6 to C30 aryl group, a substituted or unsubstituted C1 to C30 heteroaryl group, a substituted or unsubstituted C1 to C30 amine group, and a substituted or unsubstituted silyl group,
m1 is an integer ranging from 0 to 2, and
m2 and m3 are each independently an integer of 0.

6. The organic light emitting diode device of claim 5, wherein L² is a substituted or unsubstituted phenylene group or a substituted or unsubstituted naphthylene group.

7. The organic light emitting diode device of claim 1, wherein the compound represented by Chemical Formula 2 is represented by one of Chemical Formulae 2-1 to 2-24:

[2-1]
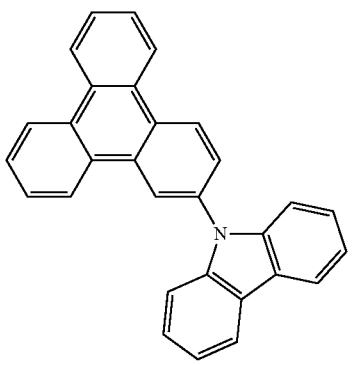

[2-2]
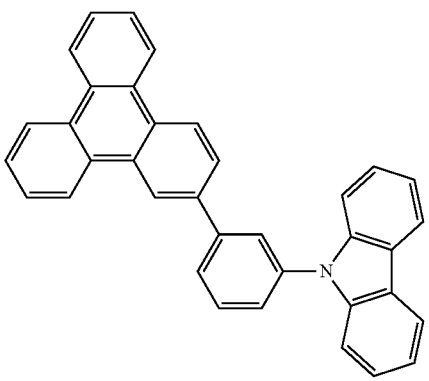

[2-3]
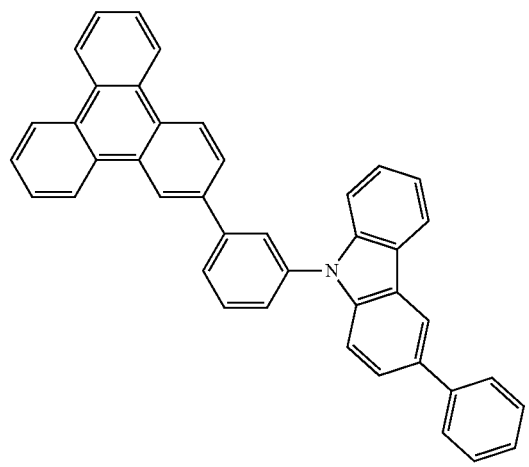
[2-4]
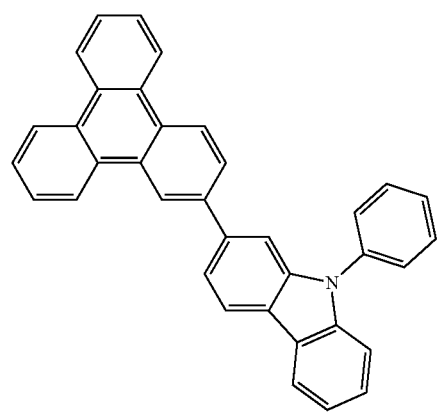
[2-5]
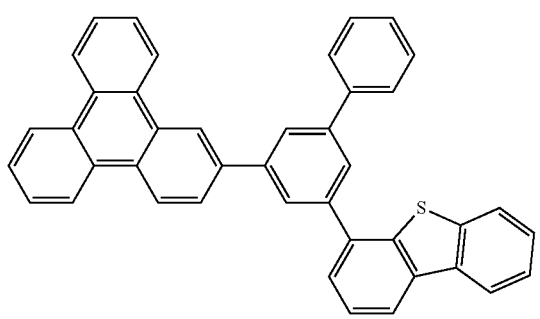
[2-6]
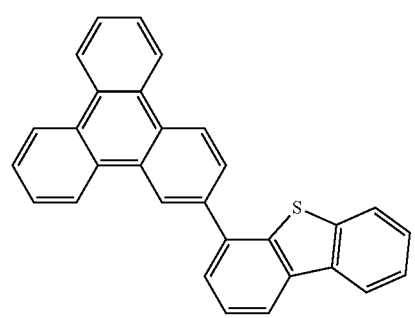
[2-7]
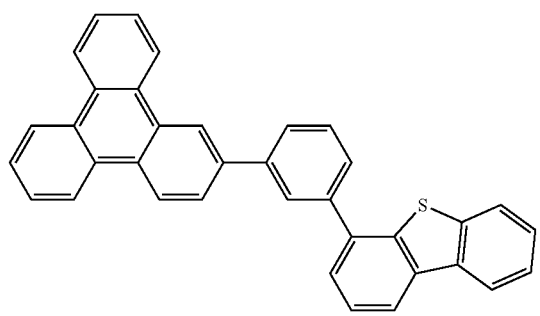
[2-8]
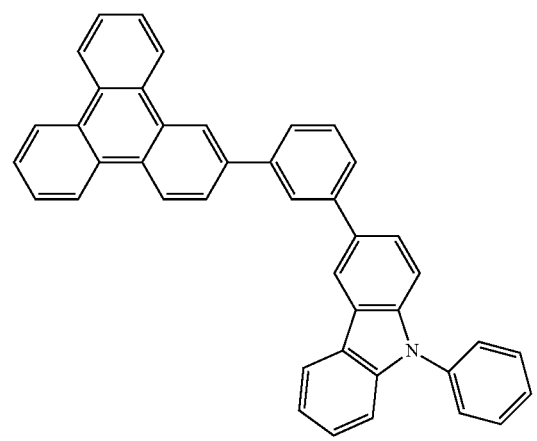
[2-9]
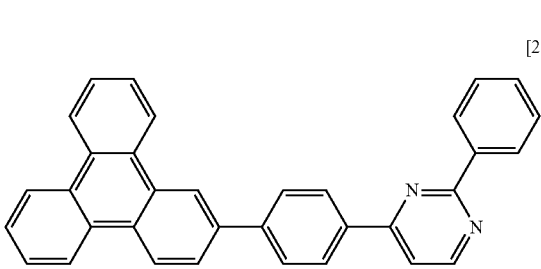
[2-10]
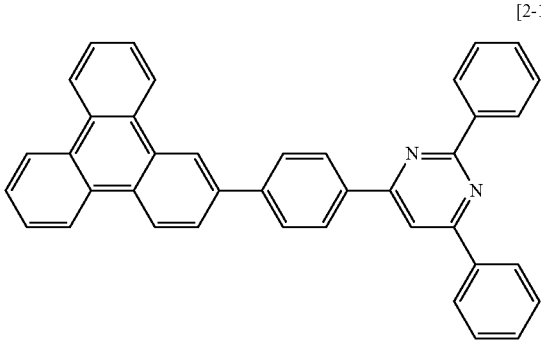

[2-11]
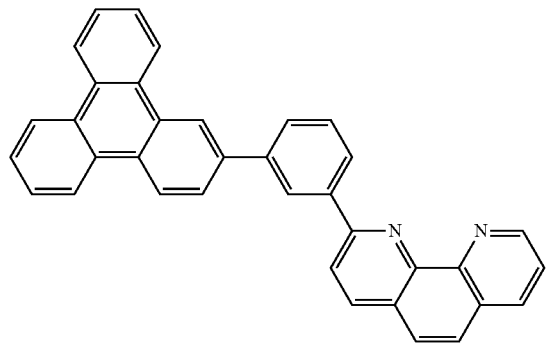
[2-12]
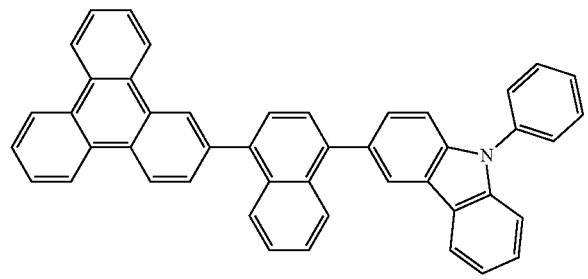
[2-13]
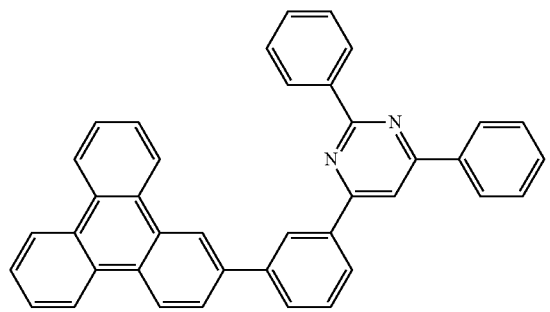
[2-14]
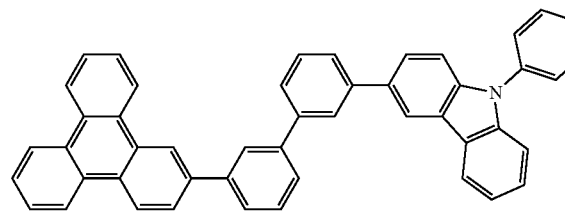
[2-15]
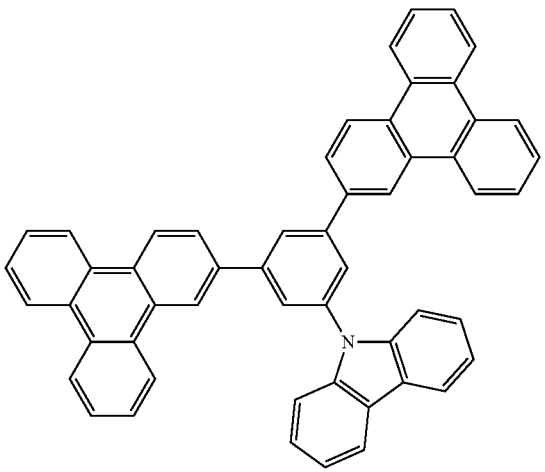
[2-16]
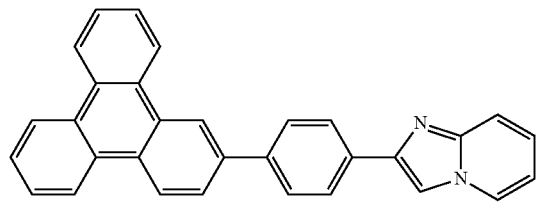
[2-17]
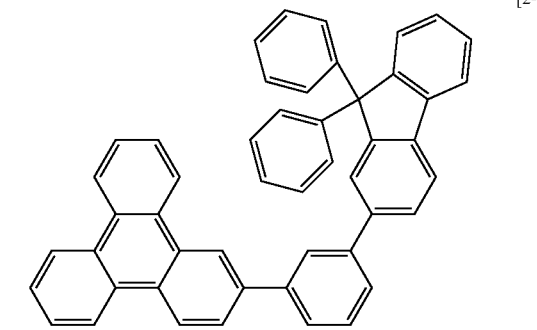
[2-18]
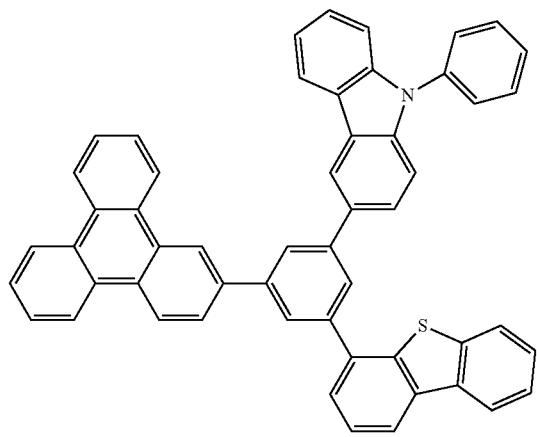

[2-19]

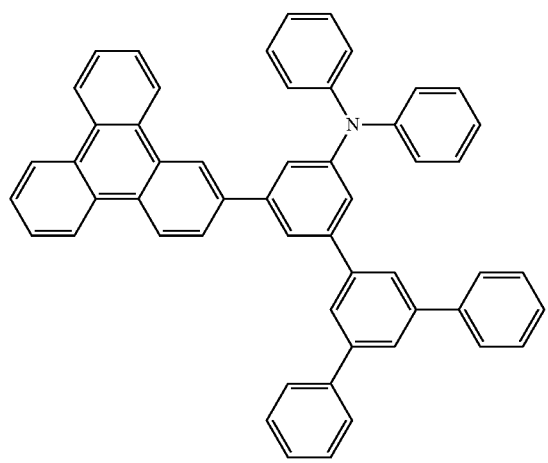

[2-20]

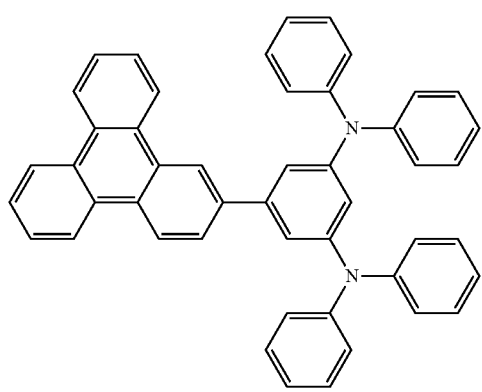

[2-21]

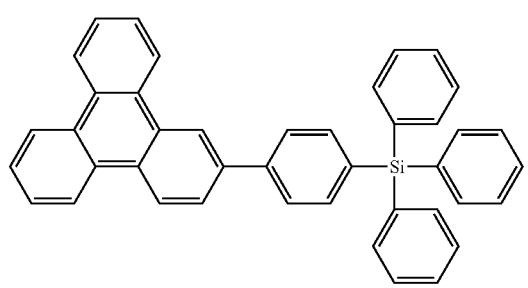

[2-22]

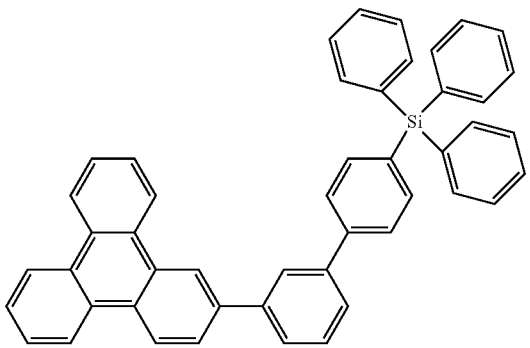

[2-23]

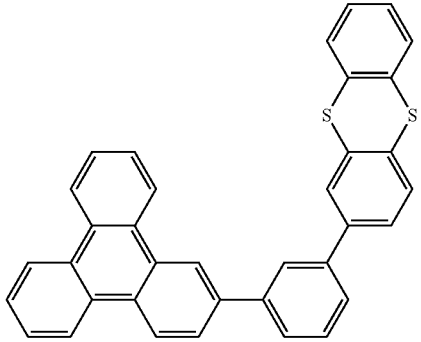

[2-24]

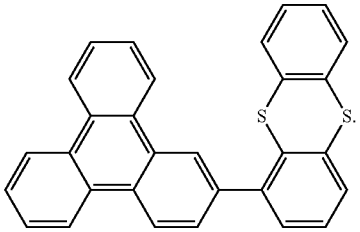

8. The organic light emitting diode device of claim 1, wherein the emission layer comprises the compound represented by Chemical Formula 2 as a host material, and further comprises a dopant material.

9. The organic light emitting diode device of claim 8, wherein the dopant material comprises a phosphorescent dopant material.

10. The organic light emitting diode device of claim 8, wherein the host material and the dopant material are provided in a weight ratio ranging from about 6:4 to about 9:1.

* * * * *